United States Patent [19]
Pern

[11] Patent Number: 6,093,757
[45] Date of Patent: Jul. 25, 2000

[54] COMPOSITION AND METHOD FOR ENCAPSULATING PHOTOVOLTAIC DEVICES

[75] Inventor: Fu-Jann Pern, Golden, Colo.

[73] Assignee: Midwest Research Institute, Kansas City, Mo.

[21] Appl. No.: 08/976,989

[22] Filed: Nov. 24, 1997

Related U.S. Application Data

[63] Continuation-in-part of application No. 08/574,813, Dec. 19, 1995, abandoned.

[51] Int. Cl.$^7$ .......................... C09D 131/04; H01L 31/09
[52] U.S. Cl. ........................... 524/99; 524/102; 524/126; 524/128; 524/153; 524/524; 524/563; 136/251; 136/252; 136/259; 156/327; 257/788; 257/789
[58] Field of Search ................................ 525/194, 332.5, 525/387; 524/99, 102, 126, 128, 153, 524, 563; 136/259, 251, 252; 156/327; 257/788, 789

[56] References Cited

U.S. PATENT DOCUMENTS

| | | | |
|---|---|---|---|
| 4,235,835 | 11/1980 | Stutzman et al. | 264/328.2 |
| 4,348,502 | 9/1982 | Coran et al. | 525/183 |
| 4,499,658 | 2/1985 | Lewis | 29/588 |
| 4,874,804 | 10/1989 | Brady et al. | 524/100 |
| 5,342,978 | 8/1994 | Enlow et al. | 554/78 |
| 5,403,892 | 4/1995 | Puydak et al. | 525/192 |
| 5,447,576 | 9/1995 | Willis | 136/259 |

OTHER PUBLICATIONS

"Improved Photostability of NREL–Developed EVA Pottant Formulations for PV Module Encapsulation," Pern, F.J. and S.H. Glick, Presented at the 26th IEEE PVSC, Anaheim, CA (Sep. 30–Oct. 3, 1997).

"Ethylene–Vinyl Acetate (EVA)Encapsulants for Photovoltaic Modules: Degradation and Discoloration Mechanisms and Formulation Modifications for Improved Photostability," Pern, F.J., 19$^{th}$ Annual Int'l Conf. on Advances in the Stabilization and Degradation of Polymers (Jun. 9–11, 1997).

"Development of New EVA Formulations for Improved Performance at NREL," Pern, F.J., NREL/SNL Photovoltaics Program Review, AIP Conference Proceedings 394, AIP Press, NY (1997), pp. 795–810.

"A Study of Various Encapsulation Schemes for c–Si Solar Cells with EVA Encapsulants," Pern, F.J., and S.H. Glick, *NREL/SNL Photovoltaics Program Review*, AIP Conf. Proc. 394 (1996), pp. 811–824.

"EVA browning and the time–dependence of I–V curve parameters on PV modules with and without mirror–enhancement in a desert environment," Berman, D. and D. Faiman, *Solar Energy Materials and Solar Cells* (1997) 43:401–412.

"Performance Degradation, Polymer Encapsulant Degradation, and Estimating Lifetimes for Photovoltaic Modules From Accelerated Testing," Czanderna, A.W. and F.J. Pern, *Durability Testing of Nonmetallic Materials* (1996), pp. 204–225.

"Thermal Processing of EVA Encapsulants and Effects of Formulation Additives," Pern, F.J. and S.H. Glick, *25th PVSC* (1996), pp. 1251–1254.

"Factors that affect the EVA encapsulant discoloration rate upon accelerated exposure," Pern, F.J., *Solar Energy Materials and Solar Cells* (1996) 41/42:587–615.

"Encapsulation of PV modules using ethylene vinyl acetate copolymer as a pottant: A critical review," Czanderna, A.W. and F.J. Pern, *Solar Energy Materials and Solar Cells* (1995) 43:101–181.

"Factors that Affect the EVA Encapsulant Discoloration Rate Upon Accelerated Exposure," Pern, F.J., *IEEE First World Conference on Photovoltaic Energy Conversion* (1994) pp. 897–900.

"Luminescence and absorption characterization of ethylene–vinyl acetate encapsulant for PV modules before and after weathering degradation," Pern, F.J., *Polymer Degradation and Stability* (1993) 41:125–139.

"Characterization of ethylene vinyl acetate (EVA) encapsulant: Effects of thermal processing and weathering degradation on its discoloration," Pern, F.J. and A.W. Czanderna, *Solar Energy Materials and Solar Cell* (1991) 25:3–23.

*Primary Examiner*—Mark L. Warzel
*Attorney, Agent, or Firm*—Ken Richardson

[57] ABSTRACT

A composition and method for encapsulating a photovoltaic device which minimizes discoloration of the encapsulant. The composition includes an ethylene-vinyl acetate encapsulant, a curing agent, an optional ultraviolet light stabilizer, and/or an optional antioxidant. The curing agent is preferably 1,1-di-(t-butylperoxy)-3,3,5-trimethylcyclohexane; the ultraviolet light stabilizer is bis-(N-octyloxy-tetramethyl) piperidinyl sebacate and the antioxidant is selected from the group consisting of tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis(4,6-di-t-butylphenyl) fluorophosponite. The composition is applied to a solar cell then cured. The cured product contains a minimal concentration of curing-generated chromophores and resists UV-induced degradation.

38 Claims, 4 Drawing Sheets

COMPOSITION AND METHOD FOR ENCAPSULATING PHOTOVOLTAIC DEVICES

CROSS-REFERENCE TO OTHER APPLICATIONS

This patent application is a continuation-in-part of U.S. patent application Ser. No. 08/574,813, now abandoned filed Dec. 19, 1995, and entitled "Encapsulating Material for Photovoltaic Devices."

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. Field of the Invention

The present invention relates generally to encapsulating materials and methods for encapsulating photovoltaic devices. In particular, this invention relates to a composition of an EVA encapsulant which minimizes discoloration, and more particularly, to an encapsulating material having enhanced photothermal and photochemical stability, and reduced concentrations of curing-generated chromophores and curing peroxide residue, and to photovoltaic devices comprising these materials.

2. Description of the Prior Art

Solar energy conversion systems experience a unique set of stresses which may affect their stability and, hence, their overall performance and efficiency in converting the dilute radiant flux into electrical power. These stresses include ultraviolet (UV) radiation, extreme temperature fluctuations, atmospheric gases and pollutants, the diurnal and annual thermal cycles, and, in concentrating systems, a high-intensity solar flux. In addition to these detrimental environmental elements, a variety of other factors, such as rain, hail, dust, wind, thermal expansion mismatches, and condensation and evaporation of water, may further reduce the performance of the solar system. To maintain long-term stability and performance, the photovoltaic (PV) module must be sealed within a suitable protective encapsulant.

The encapsulating material (commonly referred to as "pottant"), which provides physical isolation and protection for the solar cell assembly, is a critical component of the PV module. In addition to protecting the semiconducting material(s) from intense environmental impact, the pottant also provides structural support, optical coupling, electrical isolation, and thermal conduction for the arrays of solar cells and current-collecting metallic components within the PV module. See Cuddihy, E. F., et al., *Polymers in Solar Energy Utilization*, C. G. Gebelein, D. J. Williams and R. D. Deanin, eds. (ACS, Washington, D.C., 1983), pp. 353–366; Lewis, K. J., *Polymers in Solar Energy Utilization, ibid.*, pp. 367–385; Rabel, J. F., *New Trends in the Photochemistry of Polymers*, N. S. Allen and J. F. Rabek, eds. (Elsevier, Amsterdam, 1985), pp.265–288; and Cuddihy, E.F., et al., *Flat-Plate Solar Array Project Final Report, Vol. VII: Module Encapsulation*, JPL Publn. 86–11 (1986). Thus, to achieve a stable power output with a desired service life of over 20–30 years, both the encapsulant and the solar cell components must exhibit long-term weathering stability and reliable performance.

To be useful as an encapsulant for crystalline silicone (c-Si) solar cells, the encapsulating material must comprise a transparent polymer, preferably ethylene vinyl acetate (EVA), which affords good optical transmission in a prescribed spectral region, i.e., between about 290 nm and 2500 nm, and more specifically from about 380 nm to about 1200 nm. However, like other polyolefins, EVA copolymers tend to discolor as a result of thermal, photochemical, and/or photothermal degradation. Photothermal degradation develops, for example, when impurities within the polymeric matrix, such as UV-excitable chromophores, trace metals and other ionic species, function as "activation sites" for free radical formation. These activation sites are actuated by short wavelength UV light (below 385 nm) which, in the presence of oxygen, convert hydroperoxides and peroxides into free radicals. The UV-excitable chromophores are critical factors in the initiation of photo-oxidative reactions which generate hydroperoxides and thus free radicals. These free radicals, directly or indirectly via subsequent degradation reactions, induce cross-linking and/or chain scission reactions, both of which degrade the mechanical properties of the encapsulant. In particular, chain scission reactions sever intramolecular bonds, which reduces the molecular weight of the polymer and affects mechanical properties such as elongation to break. Cross-linking reactions, on the other hand, increase covalent bond formation between polymer chains, which reduces the elasticity and tensile strength of the polymer material. In addition to degrading the structural integrity of the polymer matrix, both chain scission and cross-linking reactions ultimately affect the permeability of the encapsulant, which further reduces its protective value.

The present inventor has determined that UV irradiation from exposure to sunlight causes significantly more damage to PV-module encapsulating materials than thermal degradation. To protect against UV-induced degradation, and thus improve weathering stability, conventional encapsulating materials include using stabilizing additives such as UV absorbers (UVA), UV light stabilizers (UVS), and antioxidants. The primary function of UVA is to absorb the damaging UV light and dissipate the light energy into heat or re-emit the energy as harmless light of longer wavelengths. A common UVA material is 2-hydroxy-4-n-octyloxy-benzophenone, manufactured by American Cyanamid of Bridgewater, N.J., and sold under the trademark "Cyasorb UV-531." The UVS functions as a "free radical scavenger" to neutralize free radicals within the polymeric matrix. Conventional UV stabilizers include bis-(tetramethyl piperidinyl sebacate), produced by Ciba-Geigy Corporation of Hawthorne, N.Y., and sold under the trademark "Tinuvin 770," and hindered amine light stabilizers (also known as "HALS"), such as those described in U.S. Pat. No. 5,447, 576 to Willis. The final component, an antioxidant, is used to inhibit thermal oxidation of the polymer during thermal processing, and to minimize the concentration of free radical precursors, hydroperoxides and peroxides. In commercial formulated EVA materials, the antioxidant is tris-(mono-nonylphenyl)phosphite, produced by Uniroyal Chemical Corporation of Middlebury, Conn., and sold under the trademark "Naugard P."

Despite the use of these conventional stabilizing additives, most EVA materials discolor relatively quickly to a yellow or brown color which, of course, interferes with full spectrum solar admission to the encapsulated PV device. Since the encapsulated device as well as its polymeric encapsulant are usually sandwiched within cooperating structural-assembly components, replacing the discolored encapsulant is not practical. As a result, and after only a relatively short period of time, solar transmission to the encapsulated PV device is permanently reduced and energy-collection efficiency drops dramatically. For example, browning of the EVA encapsulant reportedly reduces the annual energy output of the Carrisa, Calif., power plant by about 30%. See Gay, C. F., and E. Berman, *Chemtech* (March 1990), pp. 182–186. According to Rosenthal and Lane, the average module power output is approximately 35.9% below that of the initial performance rating, with the reduction in performance being highly variable between individual modules. See Rosenthal, A. L., and C. G. Lane, Proc. PV Module Reliability Workshop, Oct. 25–26, 1990, Lakewood, Colo., *SERI/CP*-4079, pp. 217–229. Moreover, mismatching between contiguous modules, due to severe EVA browning and nonuniform electrical degradation, reportedly reduces the power output by an additional 11.1%. See Kusianovich, V. J., *ibid*., pp. 241–245.

The foregoing field observations resulted in the so-called "EVA browning crisis" in 1990, which precipitated concerns about the future of PV power generation. Recent reports indicate that EVA browning reduces the power output of c-Si PV modules at the Ben-Gurion National Solar Energy Center in Sede Boqer, Israel, by about 1% per year. See Czanderna, A. W., and F. J. Pern, *Solar Energy Materials and Solar Cells* (1996) 43: 101–183; Berman, D., and D. Faiman, Proc. PV Module Reliability Workshop, Oct. 25–26, 1990, Lakewood, Colo., *NREL/CP*-411-7414, pp. 289–312. In addition to causing transmittance loss and mismatching between adjacent solar cells, researchers report a number of other effects of EVA degradation on PV modules. Such additional effects of EVA degradation include blistering of Tedlar backing foils due to the accumulation of gases from EVA photothermal degradation, delamination of EVA and solar cells from glass superstrates, and oxidation and corrosion of tinned copper ribbons (tabs) under browned EVA films. Such oxidation and corrosion of the metallic components can increase contact resistance, reduce the current collection efficiency, cause mismatching, and further decrease the power output of the module.

The current commercial EVA material, sold under the trademark "Elvax 150" by DuPont of Wilmington, Del., softens to a viscous melt at temperatures above 70° C. Thus, to provide a thermostable material at typical operating temperatures, the polymer must be chemically cross-linked by processing with a suitable curing agent. Curing agents used specifically for EVA include 2,5-dimethyl-2,5-di-t-butylperoxy-hexane and O,O-t-butyl-O-(2-ethylhexyl) mono-peroxy-carbonate, manufactured by Elf Atochem, Buffalo, N.Y., and sold under the trademarks "Lupersol 101" and "Lupersol TBEC," respectively.

The degree of chemical cross-linking of the cured encapsulant, generally referred to as "gel content," is expressed as the fraction (percentage) of the polymer that cannot be extracted using a suitable solvent, such as toluene or tetrahydrofuran. To provide sufficient mechanical strength to support the solar cells in a PV module, the gel content of the encapsulant must be at least 70%. The requisite gel content is typically achieved during the lamination and curing cycles of module processing. However, the degree of cross-linking in cured EVA gradually increases over time as a result of photo-oxidative degradation. See, e.g., Liang, R. H., et al., "Photothermal degradation of ethylene-vinyl acetate copolymer, *Polym. Sci. Technol*. (1983) 20: 267–278; and Pern, F. J., and A. W. Czandema, "Characterization of ethylene vinyl acetate (EVA) encapsulant: Effects of thermal processing and weathering degradation on its discoloration, *Sol. Energy Mater. Sol. Cells* (1992) 25: 3–23. As discussed above, excessive cross-linking (ie., a gel content greater than 90%) can compromise the mechanical properties of the encapsulant, such as elasticity and tensile strength.

Thus, although a fairly high initial gel content is required for thermal stability, increases in the cross-linking density can provide an additional indication of the extent of polymer degradation.

Conventional cured encapsulants generally contain high concentrations of UV-excitable chromophores. The uncured commercial EVA material, "Elvax-150," comprises short $\alpha,\beta$-unsaturated carbonyl groups, which act as photosensitizers for the photodegradation of the EVA encapsulant. During thermal processing (curing), these $\alpha,\beta$-unsaturated carbonyl groups react to produce new chromophores. See Pern, F. J., and A. W. Czanderna, supra. Although most conventional EVA formulations also contain "Cyasorb UV-531," the UVA absorbs relatively short-wavelength radiant energy, i.e., below 360 nm. Thus, because "Cyasorb UV-531" is ineffective at absorbing long-wavelength UV light (i.e., greater than 360 nm), it does not provide complete protection against UV-activation of curing-produced chromophores. The foregoing discovery by the present inventor explains why photochemical degradation remains a problem for conventional cured encapsulants, despite the presence of "Cyasorb UV-531."

Recent reports show that the curing process produces additional UV-excitable chromophores, the concentration of which depends upon the particular curing agent and curing conditions (temperature, time and pressure). Pern and Glick report that, because of their relative curing times, the "slow-cure" agent ("Lupersol 101") produces significantly more chromophores than the "fast-cure" agent ("Lupersol TBEC"). See Pern, F. J. and S. H. Glick, "Fluorescence analysis as a diagnostic tool for polymer encapsulation process and degradation," In: *12th NREL Photovoltaics Program Review, AIP Conf. Proc*. (Am. Inst. Physics, Woodbury, N.Y., 1994), 306: 573–585. [Cf. conventional lamination procedures generally require about 8–10 minutes at 120° C., whereas the typical curing time is about 40–50 minutes at 145° C. using "Lupersol 101," and about 8–10 minutes at 145° C. using "Lupersol TBEC." See, e.g., E. F. Cuddihy, et al., *Flat-Plate Solar Array Project Final Report, Vol. VII. Module Encapsulation*, JPL Publn. (1986) 86–11.] "Lupersol TBEC" is essentially depleted within about 20 minutes of thermal processing at 145° C., due to its low activation energy and short half-life. In contrast, approximately 42% of "Lupersol 101" remains after 45 minutes of curing. This high residual "Lupersol" content is significant, since this peroxide is believed to be the primary oxidizing reagent responsible for the generation of chromophores. See Pern and Glick, supra. Finally, in addition to increasing the concentration of curing-generated chromophores, longer curing times also provide the opportunity for additional deacetylation reactions, which produce acetic acid, a known EVA discoloring agent. See Czanderna and Pern, supra.

To summarize, it is desirable to produce a cured encapsulant having minimal curing peroxide residue, since peroxides promote free radical formation. It is also desirable to minimize the concentration of curing-generated chromophores, since these chromophores can enhance the EVA discoloration reactions and rate. Thus, the "fast-cure" agent, "Lupersol TBEC," is generally preferred over the "slow-cure" agent, "Lupersol 101," since the former curing agent produces lower concentrations of curing peroxide residue and UV-excitable chromophores.

Although "Lupersol TBEC" produces relatively low concentrations of curing-generated chromophores and residual curing peroxide as compared to "Lupersol 101," and thus is the preferred curing agent for EVA encapsulating materials, the use of "Lupersol TBEC" is problematic for other reasons. "Lupersol" peroxides decompose during curing and produce gaseous organic products. When produced in sufficient amounts, these gaseous products cause voids or bubbles to form in the encapsulant, which reduce the optical coupling to, and hence the conversion efficiency of, the photovoltaic device. Voids can also cause delamination of the EVA and solar cells from glass superstrates. Unfortunately, the fast-curing "Lupersol TBEC" tends to produce relatively high amounts of gaseous decomposition products. Therefore, care must be taken to control the lamination and curing conditions to minimize the potential for bubbling.

Another problem associated with conventional formulations of encapsulating materials for PV devices is the generally poor stability of the antioxidant compound against moisture and thermal decomposition. Existing commercial EVA formulations include the antioxidant "Naugard P," which Ad tends to hydrolyze in the presence of moisture (water). In addition, "Naugard P" tends to oxidize during the cure cycle, particularly when using slow-cure agents such as "Lupersol 101." Both of these factors reduce the effectiveness of "Naugard P" in protecting EVA against thermal oxidation.

A need therefore exists for an improved encapsulating material for photovoltaic devices. This improved encapsulating material should feature a variety of desirable chemical and physical properties. Specifically, the encapsulating material should provide improved photothermal and photochemical stability, a minimal concentration of curing-generated chromophores, a relatively fast curing rate, the desired degree of cross-linking, minimal gas formation (bubbling), and improved stability of the antioxidant against moisture and thermal decomposition.

SUMMARY OF THE INVENTION

Accordingly, it is a general object of this invention to provide an encapsulating material for photovoltaic devices having improved chemical and physical properties.

It is another object of this invention to provide an encapsulating material having improved photothermal and photochemical stability.

It is a more specific object of this invention to provide an encapsulating material having improved photostability against discoloration.

It is a further object of this invention to provide an encapsulating material which produces a minimal concentration of curing-generated chromophores.

It is yet another object of this invention to provide an encapsulating material which affords a minimal amount of curing peroxide residue during thermal processing.

It is another object of this invention to provide an encapsulating material that achieves a relatively fast cure rate.

It is yet another object of this invention to provide an encapsulating material having a cure rate which is comparable to or faster than the cure rate of materials comprising the conventional "fast-cure" agent, O,O-t-butyl-O-(2-ethylhexyl)-mono-peroxycarbonate, but with minimum gas formation (bubbling).

It is a still further object of this invention to provide an encapsulating material which achieves the desired degree of cross-linking (gel percent) during thermal processing.

It is a yet further object of this invention to provide an encapsulating material having an antioxidant which exhibits enhanced stability against moisture and thermal decomposition.

It is another general object of this invention to provide an encapsulating material having all of the above attributes.

It is yet another general object of this invention to provide a method for making an encapsulating material having all of the above attributes.

It is still another general object of this invention to provide a photovoltaic device having an encapsulant which exhibits all of the above attributes.

To achieve the foregoing and other objects and in accordance with the purposes of the present invention, as embodied and broadly described herein, the encapsulating composition of this invention comprises a polymer, 1,1-di-(t-butylperoxy)-3,3,5-trimethylcyclohexane as the curing agent, and an ultraviolet light stabilizer. The polymer may be an olefin-vinyl acetate copolymer such as ethylene-vinyl acetate, and preferably having a vinyl acetate content from about 25% to about 35%. The ultraviolet light stabilizer may be bis-(N-octyloxy-tetramethyl) piperidinyl sebacate. The curing agent may be present in an amount in the range of about 0.05% to about 5.0%, more preferably from about 1.0% to about 2.0%, and most preferably about 1.25%. The ultraviolet light stabilizer may be present in an amount in the range of about 0.01% to about 2.0%, more preferably from about 0.1% to about 0.5%, and most preferably from about 0.20% to about 0.25%. The composition may further include an antioxidant selected from the group consisting of tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis(4,6-di-t-butylphenyl) fluorophosponite. The antioxidant may be present in an amount in the range of about 0.01% to about 2.0%, more preferably from about 0.1% to about 0.5%, and most preferably from about 0.20% to about 0.25%. The composition may further comprise a primer, such as γ-methacryloxypropyl trimethoxysilane. The primer may be present in an amount in the range from about 0.01% to about 2.0%, more preferably from about 0.1% to about 0.5%, and most preferably from about 0.2% to about 0.3%.

In an alternate embodiment, the encapsulating composition of this invention comprises ethylene-vinyl acetate as the polymer, and 1,1-di-(t-butylperoxy)-3,3,5-trimethylcyclohexane as the curing agent. The composition may further comprise an ultraviolet light stabilizer, such as bis-(N-octyloxy-tetramethyl) piperidinyl sebacate, and/or an antioxidant, such as tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydro-cinnamate, or 2,2'-ethylidene bis(4, 6-di-t-butylphenyl) fluorophosponite. The composition may further comprise a primer, such as γ-methacryloxypropyl trimethoxysilane.

In another alternate embodiment, the encapsulating composition comprises a polymer, a curing agent, an ultraviolet light stabilizer, and an antioxidant, wherein said ultraviolet light stabilizer is bis-(N-octyloxy-tetramethyl) piperidinyl sebacate, and wherein said antioxidant is selected from the group consisting of tris(2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis(4, 6-di-t-butylphenyl) fluorophosponite. The polymer may be ethylene-vinyl acetate, and the curing agent may be 1,1-di-(t-butylperoxy)-3,3,5-trimethylcyclohexane, 2,5-dimethyl-2,5-di-t-butylperoxy-hexane, or O,O-t-butyl-O-(2-ethylhexyl) mono-peroxy-carbonate. The composition may further comprise a primer, such as γ-methacryloxypropyl trimethoxysilane.

In yet another alternate embodiment, the encapsulating composition comprises a polymer, a curing agent, and an antioxidant, wherein the antioxidant is tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, or 2,2'-ethylidene bis(4,6-di-t-butylphenyl) fluorophosponite. The polymer may be ethylene-vinyl acetate, and the curing agent may be 1,1-di-(t-butylperoxy)-3,3,5-trimethylcyclohexane, 2,5-dimethyl-2,5-di-t-butylperoxy-hexane, or O,O-t-butyl-O-(2-ethylhexyl) mono-peroxy-carbonate. The composition may also comprise a primer, such as γ-methacryloxypropyl trimethoxysilane.

To achieve the foregoing and other objects and in accordance with the purposes of the present invention, as embodied and broadly described herein, the articles of manufacture of this invention comprise a photovoltaic cell, and an encapsulating material on the upper surface of the photovoltaic cell. The encapsulating material comprises a polymer, 1,1-di-(t-butylperoxy)-3,3,5-trimethylcyclohexane as the curing agent, and an ultraviolet light stabilizer. The polymer may be ethylenevinyl acetate, and the ultraviolet light stabilizer may be bis-(N-octyloxy-tetramethyl) piperidinyl sebacate. The photovoltaic device may further comprise a layer of encapsulating material on the lower surface of the device, wherein the encapsulating material comprises a polymer, a curing agent (1,1 -di-(t-butylperoxy)-3,3,5-trimethylcyclohexane), and an ultraviolet light stabilizer.

In an alternate embodiment, the articles of manufacture may comprise a photovoltaic cell, and an encapsulating material on the upper surface of the cell, wherein the encapsulating material comprises ethylene-vinyl acetate (polymer) and 1,1 -di-(t-butylperoxy)-3,3,5-trimethylcyclohexane (curing agent). The encapsulating material may further comprise bis-(N-octyloxy-tetramethyl) piperidinyl sebacate as the ultraviolet light stabilizer.

To further achieve the foregoing and other objects and in accordance with the purposes of the present invention, as embodied and broadly described therein, one embodiment of this invention comprises a process for preparing a photovoltaic device having an encapsulant with improved resistance to UV-induced degradation and a reduced concentration of curing-generated chromophores. The method of this invention includes the steps of preparing an encapsulating material comprising a polymer, a curing agent, and an ultraviolet light stabilizer, wherein the curing agent is 1,l-di-(t-butylperoxy)-3,3,5-trimethylcyclohexane; applying the encapsulating material to the solar cell; and curing the applied encapsulating material to form a thermoset encapsulant for the solar cell. The polymer may be ethylene-vinyl acetate, and the ultraviolet light stabilizer may be bis-(N-octyloxy-tetramethyl) piperidinyl sebacate.

In an alternate embodiment, the method for encapsulating a solar cell comprises the steps of preparing an encapsulating material comprising a ethylene-vinyl acetate and 1,1-di-(t-butylperoxy)-3,3,5-trimethylcyclohexane; applying the encapsulating material to the solar cell; and curing the applied encapsulating material to form a thermoset encapsulant for the solar cell. The encapsulating material may further comprise an ultraviolet light stabilizer (bis-(N-octyloxy-tetramethyl) piperidinyl sebacate) and an antioxidant, such as tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, or 2,2'-ethylidene bis(4,6-di-t-butylphenyl) fluorophosponite.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention. In the Drawings.

DETAILED DESCRIPTION OF THE PREFERRED EMBODIMENTS

This invention relates to a composition and method for minimizing the discoloration in an encapsulant for a photovoltaic device. The composition comprises a polymer, a curing agent, an optional ultraviolet light stabilizer such as bis-(N-octyloxy-tetramethyl) piperidinyl sebacate ("Tinuvin 123") and an optional antioxidant selected from the group consisting of tris (2,4-di-tert-butylphenyl) phosphite ("Irgafos 168"), tetrakis methylene (3,5-di-tert-butyl-4-hydroxyhydrocinnamate) methane ("Naugard 10"), octadecyl 3,5-di-tert-butyl-4-hydroxyhydrocinnamate ("Naugard 76"), and 2,2'-ethylidene bis(4,6-di-t-butylphenyl) fluorophosponite ("Ethanox 398"). In a preferred embodiment, the curing agent is 1,1-di-(t-butylperoxy)-3,3,5-trimethylcyclohexane ("Lupersol 231"). This composition is cured and the subsequently formed product shows enhanced resistance to UV-induced degradation, and reduced concentrations of curing-generated chromophores and curing peroxide residue.

The polymer, commonly referred to in the art as pottant, is a polymeric compound which can be cross-linked or cured by subjecting the polymer to elevated temperatures. The polymer used in the present invention may be any polymeric compound known in the art for encapsulating photovoltaic devices. Preferably, the polymer is an olefin-vinyl acetate copolymer, particularly ethylene-vinyl acetate (EVA). EVA refers to a class of polymers which are used to improve adhesion properties of hot-melt and pressure sensitive adhesives. Preferably, the EVA copolymer has a vinyl acetate content between about 25% and about 35%. One such EVA copolymer suitable for use in the present invention is sold under the trademark "Elvax 150" by DuPont Company, Wilmington, Del.

The curing agent used in the present invention may be any curing agent (also referred to as a cross-linking or polymerization initiator) known in the art. The purpose of the curing agent is to cross-link the polymer during the cure cycle, thus providing a thermoset material which is mechanically stable at typical operating temperatures. Curing agents suitable for use in the present invention include, without limitation, 1,1-di-(t-butylperoxy)-3,3,5-trimethylcyclohexane, manufactured by Organic Peroxides Division, Atochem North America Inc., Philadelphia, Pa., and sold under the trademark "Lupersol 231"; 2,5-dimethyl-2,5-di-t-butylperoxyhexane, manufactured by Elf Atochem, Buffalo, N.Y., and sold under the trademark "Lupersol 101"; and O,O-t-butyl-O-(2-ethylhexyl) mono-peroxy-carbonate, manufactured by Elf Atochem, Buffalo, N.Y., and sold under the trademark "Lupersol TBEC."

Figure 2:
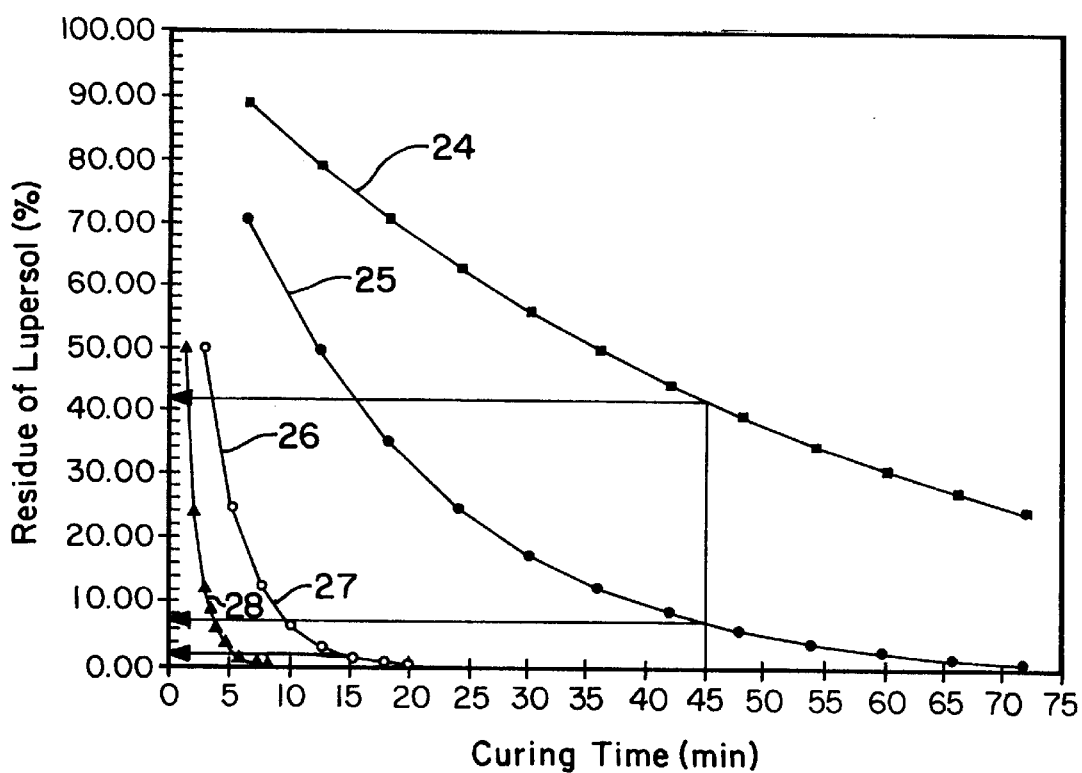
FIG. 2 is a graph of residual "Lupersol" peroxide (%) vs. the curing time (minutes), showing the calculated decomposition profiles for three "Lupersol" peroxide curing agents. The upper curve 24 of the graph represents the calculated decomposition rate for a sample of the slow-cure agent, "Lupersol 101," which was treated at 145° C. The second curve 25 represents the calculated decomposition rate for a sample of "Lupersol 101," which was treated at 155° C. The third curve 26 represents the calculated decomposition rate for a sample of the fast-cure agent, "Lupersol TBEC," which was treated at 145° C. The fourth curve 27 represents the calculated decomposition rate for a sample of the fast-cure agent used in the present invention, "Lupersol 231," which was treated at 145° C. The lower curve 28 represents the calculated decomposition rate for a sample of "Lupersol 231," which was treated at 155 ° C.
Figure 5:
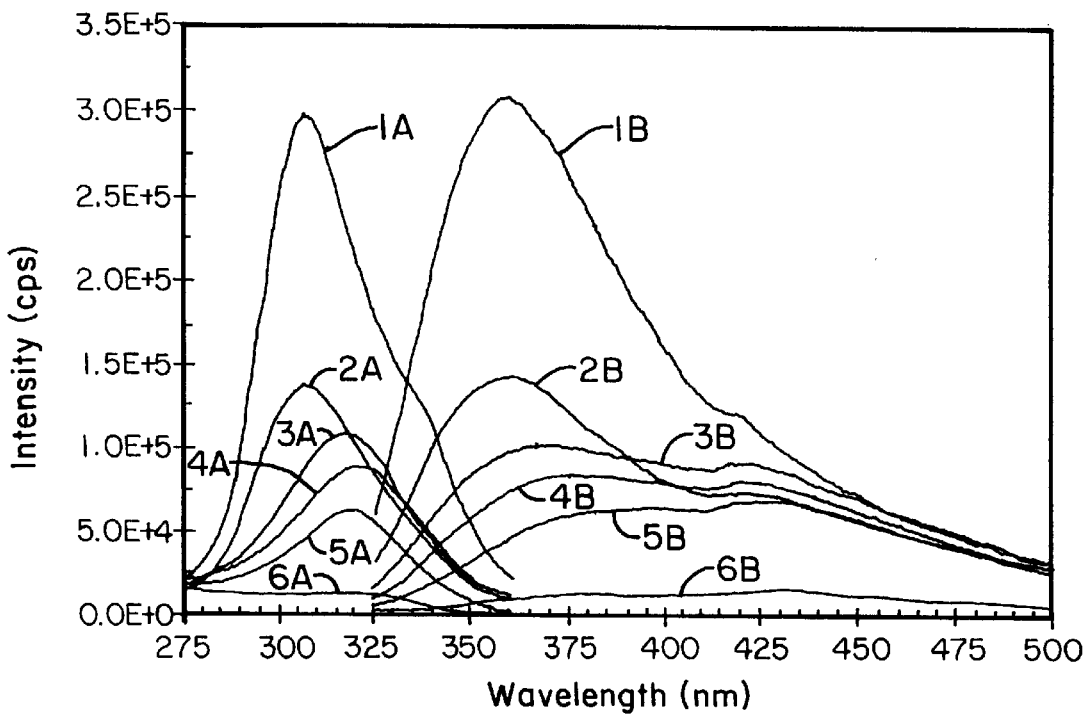
FIG. 5 is a graph of the fluorescence excitation (left side) and emission spectra (right side) for laminated and cured EVA ("Elvax") films impregnated with curing agents "Lupersol TBEC" and "Lupersol 231," with and without antioxidant ("Naugard P" and "Ethanox 398" ), before and after curing at programmed 155° C. for 4–6 minutes. The upper curves 1A and 1B represents the excitation and emission curves, respectively, for a sample of "Elvax" containing "Lupersol TBEC" and "Naugard P." The second curves 2A and 2B represent the excitation and emission curves, respectively, for a sample of "Elvax" containing "Lupersol 231" and "Naugard P." The third curves 3A and 3B represents the excitation and emission curves, respectively, for a sample of "Elvax" containing "Lupersol 231" and "Ethanox 398." The fourth curves 4A and 4B represent the excitation and emission curves, respectively, for a sample of "Elvax" containing "Lupersol TBEC," without antioxidant. The fifth curves 5A and 5B represent the excitation and emission curves, respectively, for a sample of "Elvax" containing "Lupersol 231," without antioxidant. The sixth curves 6A and 6B represent the excitation and emission curves, respectively, for a sample of "Elvax" containing "Lupersol TBEC" and "Naugard P," which was laminated at 80° C. The samples were laminated and cured in microslides, and the excitation and emission spectra were acquired separately at emission wavelength at 385 nm at excitation wavelength at 315 nm, respectively. The graph shows the effect of curing agent and antioxidant on the formation of curing-generated chromophores.
Figure 6:
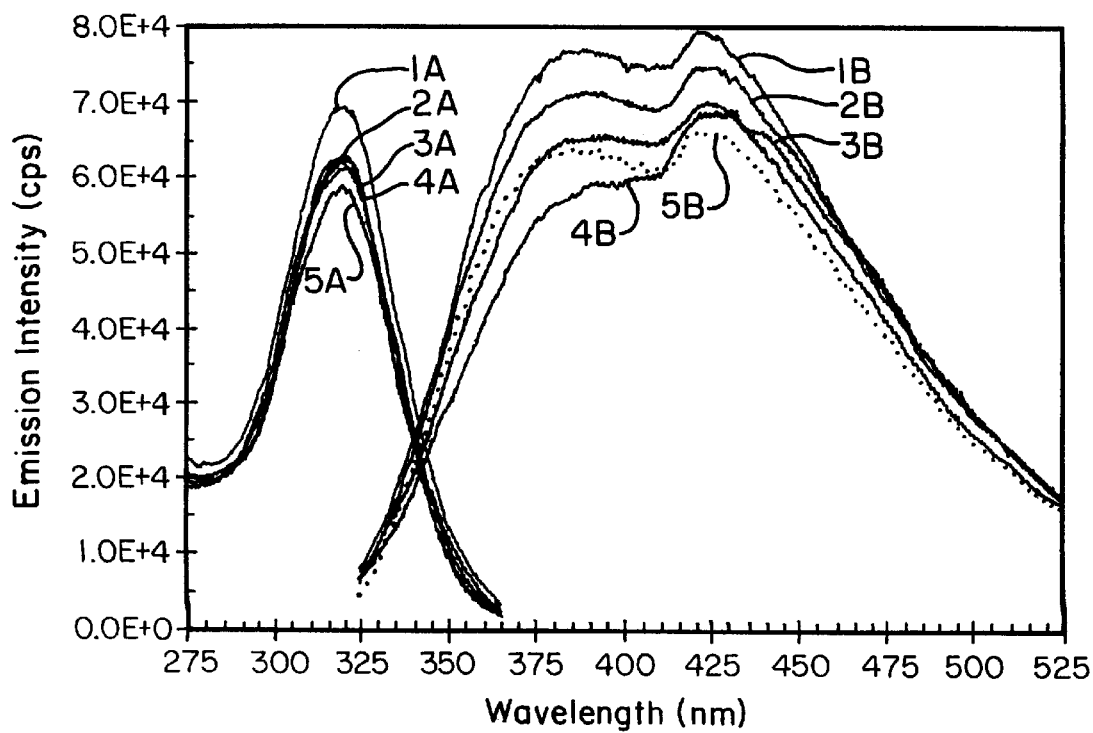
FIG. 6 is a graph of the fluorescence excitation (left side) and emission spectra (right side) for laminated and cured EVA ("Elvax") films without and without the curing agent "Lupersol 231" and antioxidants, "Irgafos 168,""Naugard 76,"and "Naugard 10."The upper curves 1A and 1B represents the excitation and emission curves, respectively, for a sample of "Elvax" containing "Lupersol 231" and "Irgafos 168." The second curves 2A and 2B represent the excitation and emission curves, respectively, for a sample of "Elvax" containing "Lupersol 231 " and "Naugard 76." The third curves 3A and 3B represents the excitation and emission curves, respectively, for a sample of "Elvax" containing "Lupersol 231," without antioxidant. The fourth curves 4A and 4B represent the excitation and emission curves, respectively, for a sample of "Elvax" alone. The fifth curves 5A and 5B represent the excitation and emission curves, respectively, for a sample of "Elvax" containing "Lupersol 231" and "Naugard 10." The samples were fast-cured at 155° C. for 4 minutes. The spectra were subtracted from those of microslide. The graph shows the effect of curing agent and antioxidant on "Elvax" degradation.

In a preferred embodiment of the invention, the curing agent is 1,1-di-(t-butylperoxy)-3,3,5-trimethylcyclohexane ("Lupersol 231"). As described in more detail below, "Lupersol 231" significantly improves the quality and stability of the cured polymer. Specifically, as shown in FIG. 2, "Lupersol 231 " provides a significantly reduced concentration of residual peroxide curing agent as compared to both the "slow cure" agent, 2,5-dimethyl-2,5-di-t-butylperoxyhexane, "Lupersol-101," and the "fast cure" agent, "Lupersol TBEC." Moreover, "Lupersol 231" provides a significantly reduced concentration of curing-generated chromophores as compared to the "slow cure" agent, 2,5-dimethyl-2,5-di-t-butylperoxyhexane ("Lupersol-101") (FIGS. 5 and 6). Moreover, "Lupersol 231" produces significantly less gas as compared to the "fast cure" agent, O,O-t-butyl-O-(2-ethylhexyl) mono-peroxy-carbonate ("Lupersol TBEC"). It is well known that gaseous decomposition products often form during curing. Gas formation results from outgassing of volatile, low molecular weight alcohol, ketone and/or organic acid by-products of the decomposition of the peroxide curing agent and/or the hydrolysis of silane primer. When produced in sufficient amounts, these gaseous products cause voids or bubbles to form in the encapsulant, which reduce the optical coupling to, and hence the conversion efficiency of, the photovoltaic device. Voids can also cause delamination of the EVA and solar cells from glass superstrates. As will be appreciated by those of skill in this art, "Lupersol 231" substantially improves the quality and stability of the encapsulant by accomplishing sufficient cross-linking in a relatively short period of time, hence minimizing the concentration of curing-generated chromophores, but without the excessive gas formation typically associated with the conventional fast-cure agent, "Lupersol-TBEC."

The amount of curing agent used may vary widely depending on the particular application. Preferably, encapsulating material comprises from about 0.05% to 5.0%, more preferably from about 1.0% to about 2.0%, and most preferably about 1.25% curing agent. In the experiments presented in the examples below, the amount of curing agent was about 1.25%. Unless indicated otherwise, the term "percent" (or "%") will be used hereinafter to indicate percentage on a weight/weight basis.

Figure 7:
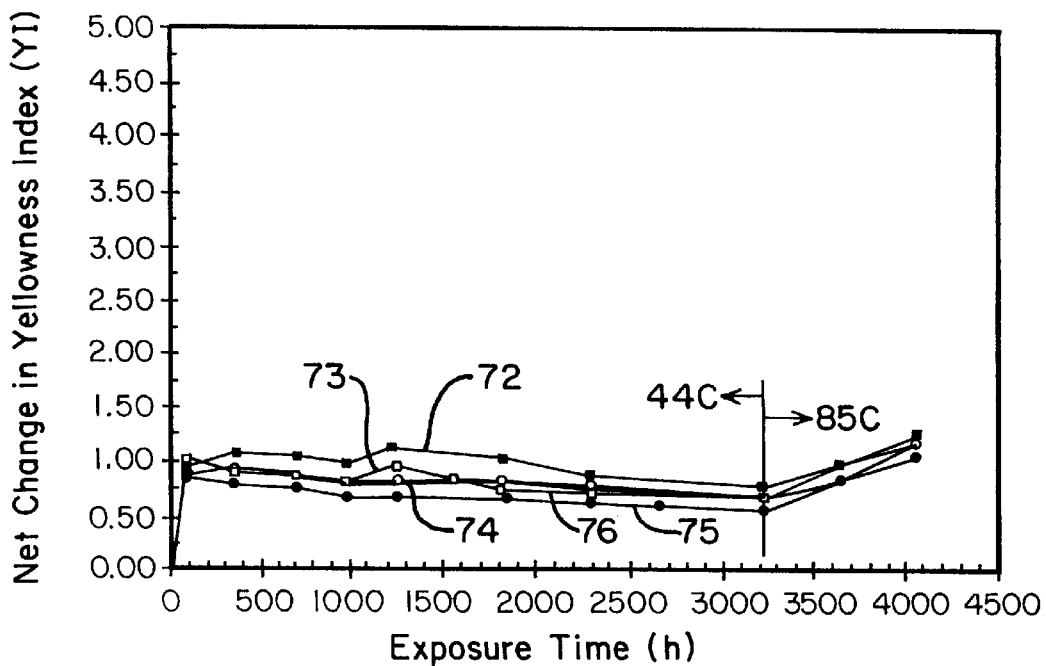
FIG. 7 is a graph showing the net change in yellowness index (YI) measured as a function of UV exposure time for a set of five encapsulating-material formulations with varying concentrations of antioxidant, as shown in Table 2. The upper curve 72 of the graph represents the discoloration for sample "V8"; the second curve 73 represents the discoloration for a sample of "V5"; the third curve 74 represents the discoloration for a sample of "V7"; the fourth curve 75 represents the discoloration for a sample of "V6"; and fifth curve 76 represents the discoloration for a sample of "V3." All samples were exposed to enhanced UV light (approx. 5 suns; 300–400 nm). As can be seen from this graph, the YI change rates for "V" formulations at 44° C. is about 0 YI/h, and the YI change rates for "V" formulations at 85° C. is about 0.10–0.18 YI/h. The initial increase in rates represents the solarization of microslide substrates.
Figure 8:
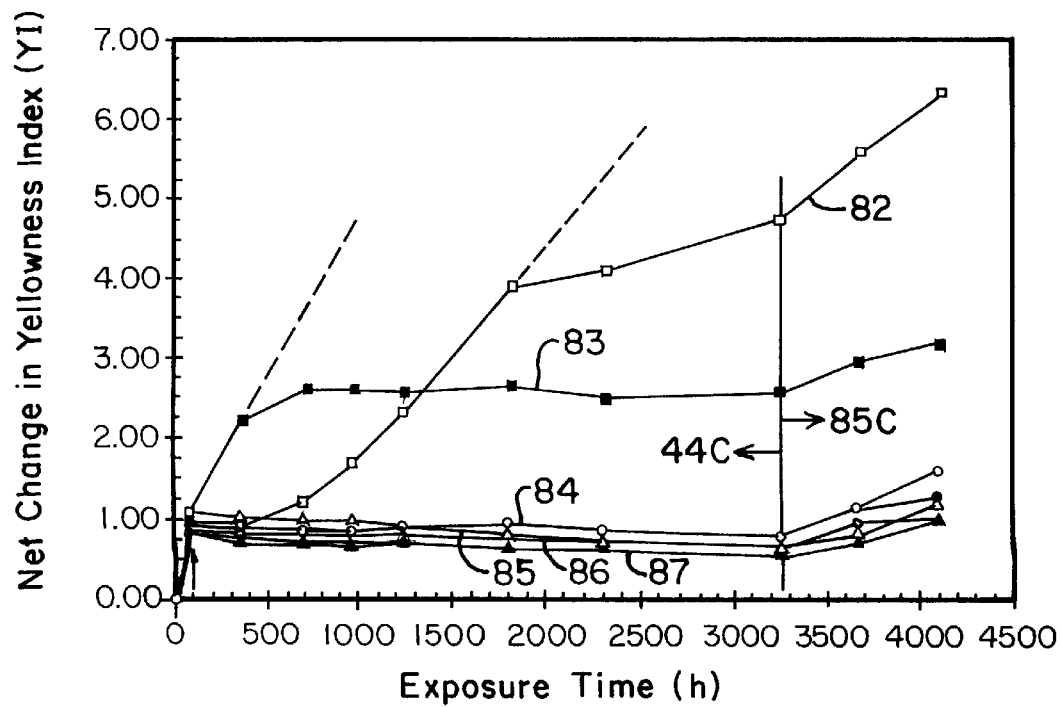
FIG. 8 is a graph showing the net change in yellowness index (YI) measured as a function of UV exposure time for a set of encapsulating-material formulations, two commercial formulations ("EVA A9918P" and "EVA 15295P") and compositions of the present invention, as shown in Table 3. The upper curve 82 of the graph represents the discoloration for sample "EVA 15295P"; the second curve 83 represents the discoloration for a sample of "EVA A9918P"; the lower curves 84 through 87 represent the discoloration for samples of "Y6" through "Y12." All samples were exposed to enhanced UV light (approx. 5 suns; 300–400 nm). As can be seen from this graph, the YI change rates for "Y" formulations at 44° C. is about 0 YI/h, and the YI change rates for "Y" formulations at 85° C. is about 0.04–0.10 YI/h. As can be seen by the slopes of curves 82 and 83, delamination of these samples begins at approximately 500 h exposure and 1700 h exposure, respectively. The dashed lines emanating from these curves represent the projected change in YI if no delamination occurred. The initial increase in rates represents the solarization of microslide substrates.

According to another embodiment of the invention, the encapsulant material includes an ultraviolet light stabilizer (UVS) to protect the polymer against photothermal degradation. Photothermal degradation generally begins at heterogeneous areas within the encapsulant, such as UV-excitable chromophores and impurities, which function as "activation sites" for free-radical formation and other degradation reactions. In this embodiment of the invention, bis-(N-octyloxytetramethyl piperidinyl sebacate), produced by Ciba-Geigy Corporation of Hawthorne, N.Y., and sold under the trademark "Tinuvin 123," is added to the uncured encapsulant composition as a free radical scavenger to neutralize the UV-generated free radicals. As described more fully below and as shown in FIGS. 7 and 8, "Tinuvin 123" provides significantly improved protection against discoloration due to ultraviolet degradation, as compared to the conventional UVS bis-(tetramethyl piperidinyl sebacate), produced by Ciba-Geigy Corporation of Hawthorne, N.Y. and sold under the trademark "Tinuvin 770." Although the amount of "Tinuvin 123" may vary depending on the particular application, the concentration will preferably be from about 0.01% to 2.0%, more preferably from about 0.1% to 0.5%, and most preferably from about 0.2% to about 0.25%.

In yet another embodiment of the invention, an antioxidant is added to the uncured polymer composition to prevent or minimize thermal oxidation during thermal processing, thereby minimizing the concentration of curing-generated chromophores, and to decompose the hydroperoxides and/or peroxides in the polymer. The antioxidant of the present invention is selected from the group consisting of tris(2,4-di-tert-butylphenyl) phosphite, produced by Ciba-Geigy Corp. Additives Department of Hawthorne, N.Y., and sold under the trademark "Irgafos 168"; tetrakis methylene (3,5-di-tert-butyl-4-hydroxyhydrocinnamate) methane, produced by Uniroyal Chemical Corporation of Middlebury, Conn., and sold under the trademark "Naugard 10"; octadecyl 3,5-di-tert-butyl-4-hydroxyhydrocinnamate, produced by Uniroyal Chemical Corporation of Middlebury, Conn., and sold under the trademark "Naugard 76"; and 2,2'-ethylidene bis(4,6-di-t-butylphenyl) fluorophosponite, produced by Ethyl Corp. of Baton Rouge, La., and sold under the trademark "Ethanox 398." As shown in FIGS. 7 and 8, the compositions of the present invention comprising the foregoing antioxidants provide significantly enhanced stability as compared to conventional antioxidants, particularly when used in combination with the preferred curing agent, "Lupersol 231." Although the amount of antioxidant may vary depending on the particular application, the concentration will preferably be from about 0.01% to 2.0%, more preferably from about 0.1% to 0.5%, and most preferably from about 0.20% to about 0.25%.

In a preferred embodiment of the present invention, the pottant material is free of an ultraviolet light absorber (UVA) component. By convention, a UVA is generally included in encapsulant materials to protect the photovoltaic device against damaging ultraviolet light. However, it has been found that such absorber materials contribute to the encapsulant discoloration and decompose photochemically, as described below and in related U.S. patent application Ser. No. 08/574,813, filed Dec. 19, 1995, now abandoned, which is incorporated by reference in its entirety herein. The present inventor discovered that this UVA material degrades relatively quickly and concomitantly contributes to the formation of a yellow or brown color which, of course, interferes with full spectrum solar admission to the encapsulated photovoltaic device. See FIG. 4. As a result, and after only a relatively short period of time, solar transmission to the encapsulated photovoltaic device is permanently reduced and energy-collection efficiency drops dramatically.

Of course, the encapsulating material used in this invention can include other additives routinely incorporated in encapsulants such as a primer to enhance adherence of the encapsulant to the photovoltaic device. The primer used in the present invention may be any primer known in the art. Such primers include, for example, compounds in the class of chemicals known generally as "organo-silanes" or "silanes." A primer which may be used with good results is γ-methacryloxypropyl trimethoxysilane, which is sold by Dow Corning of Midland, Mich., under the trademark "Z-6030," and also by Union Carbide under the trademark "A-174." Although the amount of primer used may vary depending on the particular application, the amount will typically vary from about 0.01% to about 2.0%, preferably from about 0.1% to about 0.5%, and most preferably from about 0.2% to about 0.3%. In the experiments presented in the examples below, the amount of primer was 0.25%.

The various molecular changes and rearrangements which occur during polymer photothermal degradation are well known. See, e.g., Czanderna, A. W., and F. J. Pern, *Solar Energy Materials and Solar Cells* (1996) 43: 101–183, incorporated by reference in its entirety herein. In their simplest forms, the reactions involve chain initiation, propagation, branching, and termination. The initiation process may occur by various modes, e.g., random and chain-end scission, to form free radicals. Olefinic bonds are subsequently formed through a series of propagation reactions. In photo-oxidative degradation, the initiation step occurs when oxygen reacts in the presence of water to form radicals and hydroperoxide. During the propagation step, radicals react to produce $RO_2 \cdot$, which then combines with an olefinic bond to produce a reactive radical, which in turn induces chain branching and cross-linking reactions. The final step in polymer degradation, the chain termination step, involves the conversion of free radicals into stable end products. Except for the cross-linking reactions, the products are truncated versions (i.e., lower molecular weight fragments) of the original polymer chain. To protect the polymer from these undesirable degradative reactions, various stabilizing additives are added to the uncured polymer to produce a composite formulation having improved stability.

Table 1 below provides a schematic representation of the major pathways in the photothermal degradation of EVA. As can be seen in Table 1, the principal reactions are Norrish Type II reactions, which produce acetic acid and polyenes, and Norrish Type I reactions, which produce acetaldehyde and other gases, e.g., CO, $CO_2$, $CH_4$. Aldehyde and acetic acid, which promotes auto-catalytic deacetylation reactions, are the dominant products of the photodegradation of unstabilized EVA. EVA discoloration results primarily from the formation of polyconjugated carbon-carbon double bonds (polyenes) by multi-step deacetylation reactions, and from α,β-unsaturated carbonyl groups, although other discoloration mechanisms are not excluded. See Pern and Czanderna, "EVA degradation mechanisms simulating those in PV modules, Proc. 11th Photovoltaic AR and D Review Meeting" (Am. Inst. Physics, New York, 1992) 268: 445–452; Pern, F. J., "Ethylene-vinyl acetate (EVA) encapsulants for photovoltaic modules: Degradation and discoloration mechanisms and formulation modifications for improved photostability," *Proc. 19th Annual Intl. Conf. on Advances in the Stabilization and Degradation of Polymers*, Inst. Mater. Sci., New York (1997), pp. 189–208; Pern, F. J., "Factors that affect the EVA encapsulant discoloration rate upon accelerated exposure," *Solar Energy Mater. Solar Cells* (NREL/TP-410-7700, 1996) 41/42: 587–615; and Pern, F. J., "Luminescence and absorption characterization of the structural effects of thermal processing and weathering degradation on ethylene vinyl acetate (EVA) encapsulant for PV modules," *Polym. Deg. Stab.* (1993) 41: 125–139, all of which are incorporated by reference in their entireties herein.

TABLE 1

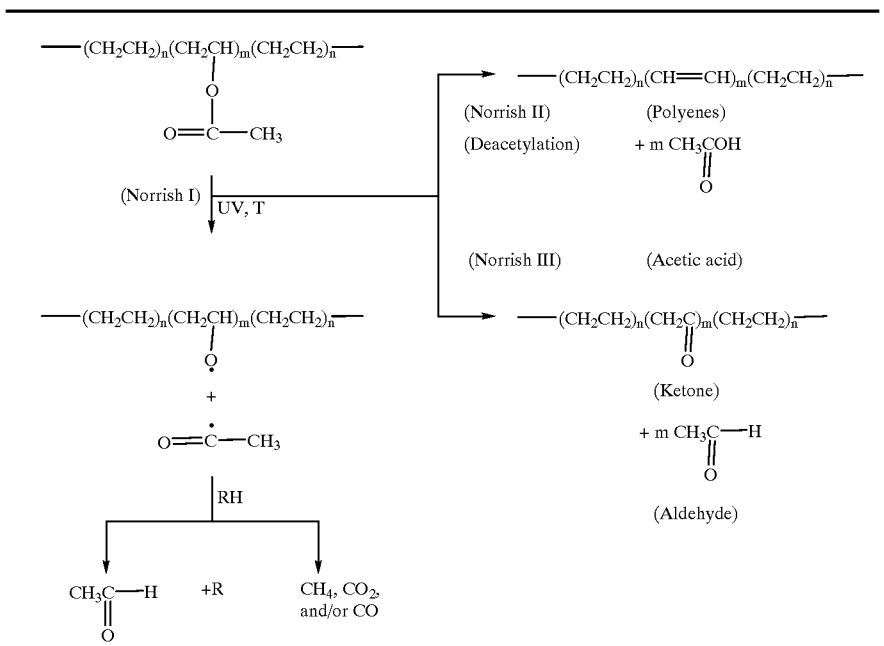

TABLE 1-continued

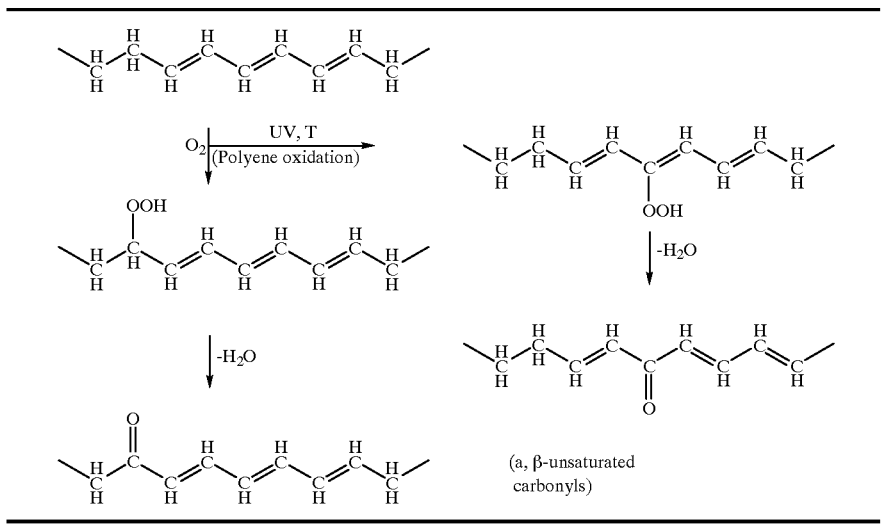

(α, β-unsaturated carbonyls)

Figure 3:
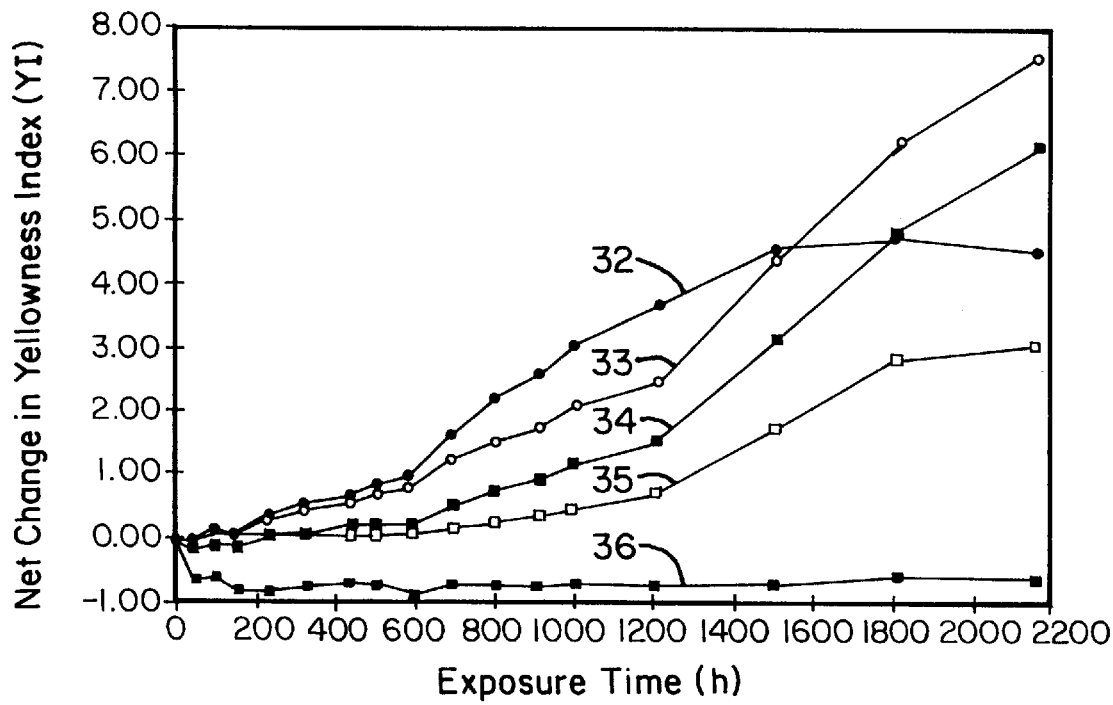
FIG. 3 is a graph showing the net change in yellowness index (YI) measured as a function of UV exposure time for a set of four EVA films (curves 32–35) with varying concentrations of "Lupersol 101" and cured at 145° C. for 40 minutes. The upper curve 32 of the graph represents the discoloration for a sample of EVA ("Elvax") comprising "Cyasorb 531" and 1.5% (wt/wt) "Lupersol 101." As can be seen by the slope of curve 32, delamination of this sample begins at approximately 1400 h exposure. The second curve 33 represents the discoloration for a sample of "Elvax" comprising "Cyasorb 531" and 1.0% (wt/wt) "Lupersol 101." The third curve 34 represents the discoloration for a sample of "Elvax" comprising "Cyasorb 531" and 0.5% (wt/wt) "Lupersol 101." The fourth curve 35 represents the discoloration for a sample of "Elvax" comprising "Cyasorb 531," but without "Lupersol 101." The lower curve 36 represents the discoloration for a sample of "Elvax" comprising approximately 0.3% (wt/wt) "Cyasorb 531," approximately 0.1% (wt/wt) "Tinuvin 770", and approximately 0.2% (wt/wt) "Naugard P", but without "Lupersol 101" and without curing.
Figure 4:
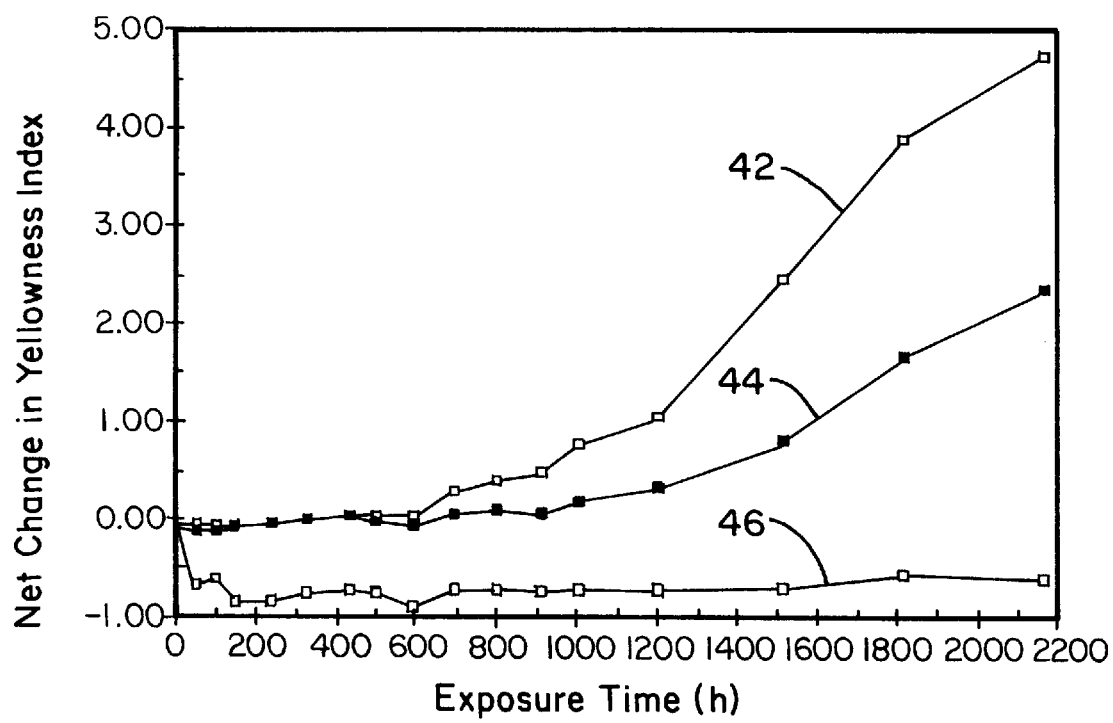
FIG. 4 is a graph showing the net change in yellowness index (YI) measured as a function of UV exposure time for a set of "Elvax" film samples that contained identical concentrations of approximately 0.3% (wt/wt) "Cyasorb 531", approximately 0.1% (wt/wt) "Tinuvin 770", and approximately 0.2% (wt/wt) "Naugard P", but without curing agent, and were "pseudo-cured" at 145° C. for 0 minutes (curve 42), 8 minutes (curve 44), and 40 minutes (curve 46).

As discussed above, one of the key discoveries is that UVA compounds such as "Cyasorb UV-531," typically included in encapsulants to absorb damaging UV light, facilitate discoloration and readily undergo photochemical degradative reactions. Thus, rather than reducing or eliminating EVA discoloration, such additives actually accelerate the process. The fact that the products of UVA degradation significantly reduce the energy-collection efficiency of the encapsulated photovoltaic device is surprising and unexpected. The mechanisms of UVA degradation and discoloration are discussed in detail in Pern, *Solar Energy Mater. Solar Cells* (1996), supra; Pern, *Inst. Mater. Sci.* (1997), supra; and Pern, *Polym. Deg. Stab.* (1993), supra. Moreover, as shown in FIGS. 2–4 and discussed more fully below, EVA discoloration is dependent upon both the residual concentration of peroxide curing agent in the cured EVA formulation, and the length of time the EVA is cured in the presence of UVA ("Cyasorb UV 531"). These two factors synergistically facilitate free radical formation to produce conjugated polyenes of various lengths. See Pern, *Inst. Mater. Sci.* (1997), supra; and Pern, *Polym. Deg. Stab.* (1993), supra. The present inventor also discovered that the photodecomposition rate of "Cyasorb UV 531" increases exponentially with the light intensity. Pern, *Polym. Deg. Stab.* (1993), supra. The rate of decomposition of "Cyasorb UV-531" can be reduced, but not eliminated, by adding the UVS "Tinuvin 770," a hindered-amine light stabilizer compound, and the antioxidant "Naugard P." Moreover, the stability of "Cyasorb UV 531" depends upon the (molar) concentration ratio of [UVS]/[UVA]. See Pern, F. J., "Modification of EVA formulation for improved stability," Proc. PV Performance and Reliability Workshop, Golden, Colo., Sep. 8–10, 1993 (NREL/TP-410-6033, 1996), pp. 358–374, which is incorporated by reference herein, and Pern, F. J., *Solar Energy Mater. Solar Cells* (1996), supra.

Another important and surprising discovery is that "Naugard P," an antioxidant included in conventional encapsulating materials to minimize thermal oxidation during thermal processing and to decompose hydroperoxides and/or peroxides, greatly increases the formation and concentration of curing-generated, UV-excitable chromophores. See FIG. 5. Moreover, the concentration of curing-generated chromophores in the cured encapsulant is directly proportional to the concentration of "Naugard P" in the uncured EVA formulation. Because the concentration of curing-generated chromophores affects the photochemical generation rates of hydroperoxides and free radicals (and discoloration rate of EVA), as previously discussed, an increase in "Naugard P" causes a corresponding increase in the formation and concentration of discoloring polyenic conjugations, thereby accelerating and amplifying the EVA discoloration. It is now known that increasing the concentration of UVS "Tinuvin 770" at a constant molar ratio of [AO]/[UVS] does not reduce the discoloration rate. See Pern, F. J., and S. H. Glick, "Thermal processing of EVA encapsulants and effects of formulation additives," 25th IEEE PVSC, May 13–17, 1996, Washington D.C. (NREL-TP-412-20380, 1996), pp. 1251–1254, and Pern, F. J., "Development of new EVA formulations for improved performance at NREL," 14th NREL/Sandia Natl. PV Prog. Rev. Mtg., NREL/TP-510-22137, Am. Inst. Physics (1997), both of which are incorporated by reference herein.

As previously discussed, the curing process produces new UV-excitable chromophores in the EVA, and the concentration of chromophores is significantly greater using the "slow-cure" agent ("Lupersol 101") than the "fast-cure" agent ("Lupersol TBEC"), primarily due to the relatively longer curing time for the former. See Pern, F. J., and S. H. Glick, "Fluorescence analysis as a diagnostic tool for polymer encapsulation process and degradation," In: *12th NREL Photovoltaics Program Review, AIP Conf. Proc.*, 306: 573–585 (Am. Inst. Physics, Woodbury, N.Y., 1994), *NREL-TP-412-5996*, incorporated by reference in its entirety herein. In addition to increasing the concentration of curing-generated chromophores, longer curing times generally result in higher concentrations of acetic acid from deacetylation reactions, and the acetic acid further increases the rate of EVA discoloration. See Czanderna and Pern, supra. In the current industrial practice, the lamination (120° C.) time is typically about 8–10 minutes, and the curing (145° C.) time is about 40–50 minutes and 8–10 minutes using "Lupersol 101" and "Lupersol TBEC," respectively. The present inventor determined that "Lupersol TBEC" is almost completely consumed within about 20 minutes of curing, whereas the calculated concentration of residual "Lupersol 101" is about 42% after 45 minutes. Significantly, as shown in FIG. 2, "Lupersol 231" provides a substantial reduction in concentration of residual peroxide as compared to both the slow-cure agent, "Lupersol-101," and the fast-cure agent, "Lupersol TBEC," particularly when using a high curing temperature (i.e., 155 ° C.). These surprising and unexpected results can be explained by the relative activation energies and half-lives of the various agents. Specifically, the activation energies for "Lupersol 231," "Lupersol TBEC," and "Lupersol 101" are about 35.5 Kcal/mol, about 31.5 Kcal/mol, and about 37 Kcal/mol, respectively. Moreover, the half life for "L 231" is about 1 minute at 155° C., and about 2.5 minutes at 145° C.; the half life for "L TBEC" is about 2.6 minutes at 145° C.; and the half life for "L 101" is about 36 minutes at 145° C., and about 12 minutes at 155° C. See, e.g., Pern, *Solar Energy Mater. Solar Cells* (1996), supra, and Pern, F. J., "Polymer encapsulants characterized by fluorescence analysis before and after degradation," Proc. 23rd IEEE PVSC, May 10–14, 1993, Louisville, Ky. (*NREL/TP*-412-5495), pp. 1113–1118, incorporated by reference herein. As discussed above, the "Lupersol 101 " peroxide facilitates photodegradation and discoloration of EVA, and also reduces the effective concentration of the antioxidant "Naugard P." Moreover, as discussed elsewhere herein and as shown by FIG. 3 (curves 32–35), the EVA discoloration rate depends upon the concentration of "Lupersol 101" in the EVA formulation. Under identical exposure conditions, the uncured film does not discolor (cf. FIG. 3, curve 36). Furthermore, because of the relatively long cure time for "Lupersol 101," additional acetic acid is produced, which "neutralizes" the UVS "Tinuvin 770" (a —NH base) in the EVA matrix and may disrupt the keto-enol tautomerism of the "Cyasorb UV 531 " molecules. Moreover, as shown in FIG. 4, the curing conditions (temperature, time, and pressure) also affect the EVA discoloration rate, as described in detail by Pern and Glick in *NREL-TP*-412-20380 (1996) and *NREL-TP*-412-5996 (1994), supra.

Yet another important and surprising discovery is that UV light-induced reactions are the primary cause of the encapsulant discoloration. The discovery that UV exposure is more damaging to polymeric materials than thermal degradation is surprising, particularly when viewed in light of the teachings of the prior art. As taught by Willis et al., it was generally believed, prior to the current invention, that thermal exposure is the dominant stress on the encapsulation system. See, e.g., U.S. Pat. No. 5,447,576, column 5, lines 62–65. While exposure to high temperatures may play a significant role in polymer degradation, the present inventor has discovered that the damage caused by thermal stress is secondary to UV-induced damage. For example, ovenheating (85° C.) EVA-encapsulated c-Si solar cells in the dark for 198 days caused only slight discoloration of the EVA (i.e., produced a light yellow color), and reduced the conversion efficiency of the encapsulated device by about 3%. In comparison, exposing the c-Si solar cells to UV light under otherwise identical conditions (i.e., 85° C. for 198 days) caused significant browning and reduced the conversion efficiency by about 15% to 19%. See Pern, F. J., *Polym. Deg. Stab.* (1993), supra; Pern, F. J. "A Comparative Study of Solar Cell Performance Under Thermal and Photothermal Tests," Proc. PV Performance and Reliability Workshop," Golden, Colo., Sep. 16–18, 1992 (*SERI-CP*-411-5182), pp. 327–344, incorporated by reference herein; and Pern, F. J., *NREL/TP*-412-5495, supra. Moreover, as discussed above, the acetic acid produced during curing may further increase the EVA discoloration rate. See Pern, F. J., "Investigation of EVA degradation mechanisms," Proc. NREL 11th PV Rev. Mtg., Denver, Colo., May 13–15, 1992, *NREL/CP*-413–4845, p. 109, incorporated by reference herein.

Another important factor affecting the net EVA discoloration rate is the photobleaching reactions in the presence of air (oxygen). In the Carrisa Plains PV modules, for example, EVA browning usually appears in the central regions of the solar cells, with a typically 3–10 mm clear band around the cell perimeter. No discoloration is observed in the EVA between adjacent solar cells. It is believed that the clarity at the edges results from diffusion of oxygen from between adjoining cells, and from the spaces between the modules and the Tedlar backing foil. In other words, photo-induced discoloration reactions are competing with the photobleaching (photo-oxidation) reactions. Photo-oxidative reactions are known to cause color bleaching and destruction of the polyenic conjugations. See Pern, F. J., *SERI-CP*-411-5182, supra; and Pern, F. J. and S. H. Glick (1994), supra.

As is evident from the foregoing discussion, a number of critical factors (which are interactive and interrelated) influence the degradation and discoloration rate of EVA encapsulants. Such factors include, inter alia, the stabilizing additives in the EVA formulation and the interactions between these additives, the loss rate of the UV absorber, the curing agent and curing conditions (temperature, pressure, and time), the concentration of curing-generated chromophores, and the photobleaching reactions resulting from diffusion of air into the laminated films. Accordingly, the selection of stabilizing additives and the development of an EVA encapsulating material having improved weathering stability is an empirical process. To identify additives which improve the stability of EVA encapsulating materials, a number of stabilizers, antioxidants, and curing agents were studied to determine their effects on EVA degradation and discoloration.

In the present invention, accelerated aging tests were performed to compare the stability of the EVA copolymer "Elvax 150" in various formulations containing different UV stabilizers, antioxidants, and curing agents. See FIGS. 7 and 8. Several important results are evident. First, it is possible to alleviate all of the above-discussed degradative factors, and produce an improved encapsulating material having enhanced resistance to discoloration, by eliminating the UVA component, and using the stabilizing additives in accordance with the present invention. Specifically, this improved encapsulating material provides the following significant advantages: (1) a substantial reduction in curing-generated UV-excitable chromophores; (2) increased resistance to hydrolysis; (3) improved scavenging (neutralization) of degradative free radicals produced by photo-oxidative reactions; (4) prolonged shelf life; and (5) a fast cure rate without the associated bubbling problem. It was also discovered that the conventional UVA compound, "Cyasorb UV-531," is highly susceptible to photochemical degradative reactions, which accelerate the EVA discoloration rate and thus reduce the energy-collection efficiency of the encapsulated PV device. Moreover, it is possible to reduce or eliminate the foregoing problems associated with the use of "Cyasorb UV-531" by omitting this UVA compound from the uncured encapsulating material. As a result of the modifications in the EVA formulations described herein, the encapsulating material of the present invention offers the above-mentioned advantages, as well as the following benefits: (1) a significant improvement in photostability (i.e., resistance to UV-induced discoloration); (2) sufficient cross-linking under relatively mild curing conditions (i.e., 4–6 minutes at 155° C., and under reduced pressure); (3) little or no curing peroxide residue in the cured encapsulant; (4) the desired degree of cross-linking (about 80% gel content); (5) little or no gas formation, and (6) improved resistance to thermal degradation reactions.

The method of encapsulating a photovoltaic device according to the present invention begins by preparing an encapsulating material, which involves combining and mixing the component ingredients. The components include an EVA copolymer, a curing agent, and an optional UV stabilizer, and an optional antioxidant. Preferably, the curing agent is "Lupersol 231," the UV stabilizer is "Tinuvin 123," and the antioxidant is selected from the group consisting of "Irgafos 168," "Naugard 10,""Naugard 76,"and "Ethanox 398." These are incorporated by conventional blending techniques. The resulting mixture is then applied to a photovoltaic device in a conventional manner, such as by standard deposition techniques or by molding. Finally, the coated photovoltaic device is subjected to thermal processing (heating) to cure (cross-link) the deposited material. It is during this heating step that gas formation from peroxide decomposition products can occur in the laminate. To minimize gas formation, it is preferable that the curing agent be "Lupersol 231," and the heating step be carried out in the range of from about 150° C. to about 160° C., and for a period of from about 4 to about 6 minutes. This heating step is preferably carried out under reduced pressure. The particular steps of the curing process are well known to those of skill in the art, and thus will not be described in further detail herein.

Figure 1:
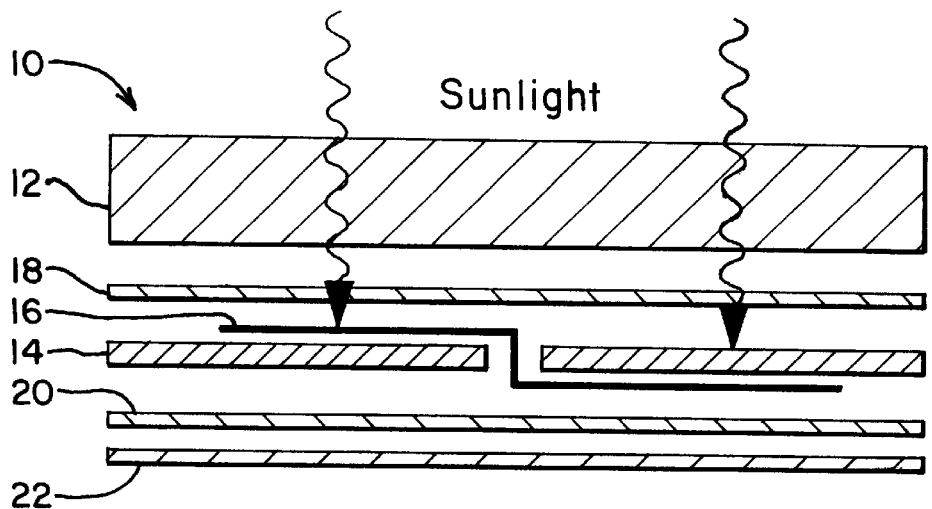
FIG. 1 is a cross-sectional view (not in actual scale or proportion) of a photovoltaic device, such as a solar cell, in accordance with the present invention.

FIG. 1 shows a cross-sectional view of a photovoltaic device of the present invention. The photovoltaic device generally referred to by reference number 10 comprises a transparent superstrate 12, such as glass or polymer film, through which radiant energy enters the device. The core of the device 10 is the photovoltaic cell assembly which is composed of a plurality of photovoltaic cells 14 interconnected by wires 16 to conduct electricity from cell to cell and ultimately out of the device 10 for recovery and use. A first layer of encapsulating material 18 is positioned adjacent the upper side of the cell assembly, and a second layer of encapsulating material 20 is positioned adjacent the lower side of the assembly. The encapsulating materials 18 and 20 thus replace the conventional encapsulating materials commonly used in photovoltaic devices. A substrate 22, such as a Tedlar backing foil, is positioned beneath the lower layer of encapsulating material 20.

The illustrations of photovoltaic device 10 and its various portions or components in FIG. 1 are not intended to be drawn to scale or even in proportion, because the very thin components and layers of the photovoltaic device 10 are impractical, if not impossible, to illustrate to scale or in proper proportion. Therefore, this figure is for illustrative purposes only, as will be understood by persons skilled in this art.

As is apparent to one skilled in the art, the superstrate 12 must be optically transparent over the range of light wavelengths for which transmission through the superstrate is desired. Suitable transparent superstrates 12 allowing transmission of visible light include glass and polymer films. Also, the transparent superstrate 12 must be of a material capable of withstanding heat treatment at temperatures of about 150° C. or more, and the encapsulating material 18 and 20 must adhere to the transparent superstrate 12 and the substrate 22.

To further enhance the long-term weathering stability, the photovoltaic device 10 may include a UV-filtering, cerium oxide-containing (ceria-doped) glass superstrate, the construction of which is known in the art and not a part of this invention. Such Ce-containing glass superstrate function to prevent short wavelength UV light (below about 350 nm) from reaching the encapsulating material, thereby minimizing the opportunity for UV-induced degradation reactions.

The following examples demonstrate the practice and utility of the present invention but are not to be construed as limiting the scope thereof. Any suitable laboratory equipment known to those skilled in the art can be utilized to fabricate encapsulating material and solar cells, and analyze electrical and optical properties. In the examples, the absorbance and transmittance were measured using an HP-8452A UV-visible spectrophotometer. Color indices were determined using a HunterLab UltraScan™ spectrocolorimeter (375–750 nm). Fluorescence analysis was performed using a SPEX FL112 Fluorolog-II spectrofluorometer using a "front face" emission monitoring geometry and a solid sample holder, to secure the samples at a fixed angled position. See Pern, F. J., NREL/TP-412–5495, supra; and Pern, F. J. and Glick, S. H., "Fluorescence Analysis as a Diagnostic Tool for Polymer Encapsulation Processing and Degradation," AIP Conf. Proc. 12th NREL PV Prog. Rev. Mtg, supra. Solar cell efficiency was measured using a light-intensity-calibrated Spectrolab X-25 solar simulator and single-crystal Si reference solar cells. The spectral response (quantum efficiency) was measured using a computerized system with periodic (440 Hz) monochromatic light directed through one of an array of 10-nm bandpass interference filters. The cell efficiencies and quantum efficiencies are accurate to ±1% and ±2%, respectively. See Czanderna, A. W., "Overview of current issues: PV cell and module performance and reliability," Proc. PV Performance and Reliability Workshop, B. Kroposki ed., Sep. 4–6, 1996, Lakewood, Colo., pp. 29–42 (NREL/CP-411-21760); and Pern. F. J., and Glick, S. H., "A study of various encapsulation schemes for c-Si solar cells with EVA encapsulants" (NREL/TP510–22157), presented at 14th NREL/Sandia National PV Program Review Meeting, 1997, Amer. Inst. Phys. (AIP), both of which are incorporated by reference in their entireties herein.

EXAMPLES

Example 1

Materials and Sample Preparation

1. Degraded EVA films. Pieces of degraded EVA films were removed from between the cover glass superstrate and solar cell assemblies of field-weathered PV modules. The EVA films showed color ranging from light yellow to yellow, yellow-brown, and brown.

2. Commercial EVA formulations. Two formulated versions of the "Elvax-150" and "Elvax-3185" were used as the commercial EVA formulations in the following examples. "EVA A9918(P)" and "EVA 15295(P)" were used as supplied by the manufacturer, Springborn Laboratories, Enfield, Conn. The two formulations both contain the conventional curing agents and stabilizers, but differ in the type of curing agent. In particular, "EVA A9918(P)" contains the slow-cure agent "Lupersol 101," whereas "EVA 15295(P)" contains the fast-cure agent "Lupersol TBEC." "P" refers to "primed" with a silane primer ("Z-6030"). The as-extruded, uncured films are 0.46 mm (18 mils) in thickness.

3. Stock solutions of UVA. To analyze the photodecomposition and stability of UV absorbers, stock solutions were prepared in HPLC-grade cyclohexane with or without "Elvax 150" ("EVX"), the rawmaterial of the EVA copolymer (33% vinyl acetate by weight). The samples were tested either in cyclohexane solutions or as "EVX" thin films cast in quartz cuvettes that allowed direct absorbance measurements.

4. Improved EVA encapsulation formulations. Stock solutions of EVX were prepared with cyclohexane or tetrahydrofuran (THF) solutions. UV light stabilizers and antioxidants were used as provided by the manufacturers, without further purification. Concentrations or quantities of additives (molar or weight ratios) used in the modified formulations were calculated prior to sample preparations according to the experimental design. EVX films of various formulations were first cast and dried gradually in Petri dishes and then used in subsequent sample lamination and curing.

Example 2

Lamination and Curing

Various superstrates and substrates of glass plates and polymer films were used for lamination of EVA films. Later samples were processed in a custom-built, double-bag vacuum laminator with a microprocessor controller, using programmed temperature-time-pressure profiles as described elsewhere. See Pern, F. J., "Modification of EVA Formulation for Improved Stability," Proc. PV Performance and Reliability Workshop, Golden, Colo., Sep. 8–10, 1993, NREL, pp. 358–374. (NREL/TP-410-6033). Typically, lamination was conducted by heating at 110°–120° C. for 10 minutes followed by curing at about 145° C. for about 40 minutes for "EVA A9918(P)" and at about 145° C. for about 8 min for "EVA 15295(P)." Solar cells already encapsulated between a glass superstrate and a polymer backing foil were used as provided by the PV manufacturers.

Example 3

Chemical Analysis of EVA Encapsulating Materials

Methanol was used to extract the soluble components (additives) while keeping the EVA film from swelling. THF was used to dissolve the stabilizers and amorphous EVA from the cross-linked EVA. The solvent-treated films were dried in a vacuum oven at 35° to 40° C. for at least 24 h. The gel content was determined from the ratio of the weights of the film samples before and after THF extraction. Thermogravimetric analysis (TGA) was performed on a Perkin-Elmer TGS-2 system at a temperature ramp rate of 5° C./min in dry $N_2$, $O_2$, or $O_2$ saturated with water moisture at a flow of 40 cc/minute.

Example 4

Accelerated Exposure and Light Sources

Depending upon the experimental design, samples were exposed by one of four light sources: (1) an exposure chamber equipped with three General Electric 100-W RS4 UV lamps and a turntable; (2) an Oriel condensable 1-kW Xe arc lamp operated in a condensed mode (to a light beam size of about 2.5-cm-diameter and a about 17-sun intensity integrated over the 300–400 nm range); (3) an Oriel 1-kW enhanced-TV solar simulator (about 4.8 suns in the 300–400 nm range measured under a $\frac{1}{8}$" borosilicate filter plate); and (4) DSET Suntest CPS tabletop exposure systems (about 1.1–1.2 suns in the 300–400 nm range). Detailed descriptions of the last three light sources and their intensities are provided elsewhere. See Pern, F. J., "Factors That Affect the EVA Encapsulant Discoloration Rate Upon Accelerated Exposure," Solar Energy Materials and Solar Cells, 41/42 (1996) 587–615. (NREL/TP-412-7700). The conditions and length of exposure are indicated in the figures. Black panel temperatures (BPT) were monitored during sample exposures. Vacuum ovens were used for thermal heating in the dark.

Example 5

Discoloration Effects of Peroxide Curing Agent and Curing Time

To determine the effects of peroxide curing agent ("Lupersol 101") concentration on EVA discoloration in conventional encapsulating materials comprising the UVA "Cyasorb UV-531," five sets of samples were prepared and analyzed as described in Examples 1–5. As described above, the UVA decomposes photochemically and its decomposition rate is directly related to the temporal evolution of discoloring polyenic chromophores. Typically, the loss rate of the UVA and the progress of "EVA A9918" discoloration from light yellow to brown follow a sigmoidal pattern. See Pern, F. J., Solar Energy Materials and Solar Cells (1996) 41/42: 587–615.

As shown in FIGS. 3 and 4, both the "Lupersol 101" concentration and the curing time in the presence of "Cyasorb UV-531" effect the EVA discoloration rate. These factors synergistically contribute to or induce the photo-oxidative reactions of EVA involving the formation and propagation of free radicals, and result in mixed formations of conjugated polyenes of various lengths. See also Pern, F. J., "Ethylene-vinyl acetate (EVA) encapsulants for photovoltaic modules: Degradation and discoloration mechanisms and formulation modifications for improved photostability," Proc. 19th Annual International Conference on Advances in the Stabilization and Degradation of Polymers, Inst. Mat. Sci. (1997) pp. 189–208, and Pern, F. J., Polym. Deg. And Stab. (1993) 41: 125–139, both of which are incorporated by reference herein.

Example 6

Photostability of Improved Encapsulating Materials

To compare the photostability of the encapsulating materials of the present invention with those of conventional materials, the respective samples were prepared and analyzed as described in Examples 1–5, using the concentrations shown in Tables 2 and 3 below. The results are shown in FIGS. 7 and 8. As is evident from the discoloration rates shown in these Figures, the compositions of the present invention provide substantially improved photostability as compared to conventional EVA formulations, i.e., the discoloration rate is approximately zero after about 3000 h exposure time. All of the samples were UV-exposed simultaneously. From measured net changes in the yellowness index ($\Delta$YI), the samples of the various formulations that are laminated/cured between a borosilicate superstrate and a soda lime microslide substrate show no UV-induced discoloration (rate ≡0 $\Delta$.YI/hr) after exposing to the 5-sun UV light (300–400 nm) for about 3250 h at a BPT of about 44° C., which is roughly equivalent to 7.4 years for an average 6-h daily solar exposure in Golden, Colo., USA, at the same BPT. Subsequently, the samples were placed inside an aluminum sample chamber with heating foils, and the UV exposure was continued at an elevated BPT of 85° C. for an additional 850 h, roughly equivalent to 2 more years. Under such harsh exposure conditions, a discoloration rate of 0.10–0.18$\Delta$YI/h was measured for the samples of "V" formulations and 0.04–0.10 $\Delta$YI/h for the "Y" formulations. Furthermore, only a few samples of the "V" and "Y" formulations showed a minor degree of edge delamination at a much later stage of UV exposure (probably after 2500 h) at 44° C., compared to the visible delamination seen earlier in "EVA A9918" at less than 800 h. The sample of "EVA 15295" probably also delaminated after about 1800 h, as suggested by the YI data curve. The premature delamination of "EVA A9918" upon UV exposure at a PBT of 44° C. in the ambient resulted in photobleaching reactions that prevented further discoloration of the sample, and a relatively constant $\Delta$YI was thus obtained. Interestingly, the visible delamination around the edges of samples, including the "EVA A9918" sample, disappeared after the samples were heated at 85° C. for some time. The "self-sealing" effect is attributed to softening and flowing of the EVA at elevated temperatures.

Several conclusions can be drawn from the results of this experiment. First, the actual weight percent of ultraviolet light stabilizers and antioxidant (vs. "Elvax") should be low, preferably less than about 0.25%. Second, the molar ratio of [UVS]/[AO] is preferably about 1.0. "Lupersol 231" provides better resistance to discoloration than "Lupersol TBEC," and thus is the preferred curing agent. The optimal concentration of curing agent appears to be about 1.25%.

Example 7
Effect of Curing Agents and Antioxidants on Formation of Chromophores Fluorescence excitation and emission spectra were used to evaluate the effect of the antioxidant "Naugard P" on the formulation of curing-generated chromophores. "Naugard P" is used in both "EVA A9918P" and "EVA 15295P" commercial formulations. The results are shown in FIGS. 5 and 6. As can be seen in FIG. 6, a large increase in the chromophore concentration was observed for the EVA films cured with "Lupersol TBEC" in the presence of "Naugard P" (curves 1A/1B vs. 4A/4B). Accordingly, curing of the two commercial EVA formulations in the presence of "Naugard P" will inevitably increase the concentration of UV-excitable chromophores, which can lead to enhanced Norrish degradation reactions.

In principle, greater polymer photostability can be realized if the concentrations of degradation-inducing chromophores can be minimized. See, McKellar, J. F., and Allen, N. S., "Photochemistry of Man-Made Polymers," *Appl. Sci.*, London (1979). As is evident from FIGS. 5 and 6, the curing agent "Lupersol 231" performs better than "Lupersol TBEC." In addition, the antioxidants "Irgafos 168," Naugard 76," and "Naugard 10" all perform better than the conventional antioxidant, "Naugard P."

TABLE 2

| Formula Name Additive | F.W. (g/mol) | Solution Concentrations | | | | Desired | | | Actual | Actual | Volume | Add |
|---|---|---|---|---|---|---|---|---|---|---|---|---|
| | | Weighed (g) | C6H12 (ml) | [Conc] (mg/ml) | [Conc] (M) | Add/EVX wt % | Weight (mg) | Equivalent (mmole) | AO/UVS wt % ratio | AO]/[UVS olar ratio | added (ml) | Volume (ml) |
| NREL-V1 | | | | | | | | | | | | |
| Elvax 150 | | 2.000 | 40.0 | 50.00 | | 100.00 | 2000.00 | | | | 40.000 | |
| Tinuvin 123 | 737.20 | 1.0038 | 40.0 | 25.10 | 0.034 | 0.00 | 0.00 | | | | 0.000 | |
| Irgafos 168 | 647.00 | 1.0012 | 40.0 | 25.03 | 0.039 | 0.00 | 0.00 | 0.000 | #DIV/0! | #DIV/0! | 0.000 | |
| Lupersol 231 | 302.50 | 1.0043 | 40.0 | 25.11 | 0.083 | 1.25 | 25.00 | 0.083 | | | 0.996 | |
| Primer Z-6030 | 248.35 | 1.0066 | 40.0 | 25.17 | 0.101 | 0.250 | 5.00 | 0.020 | | | 0.199 | 1.194 |
| NREL-V2 | | | | | | | | | | | | |
| Elvax 150 | | 2.000 | 40.0 | 50.00 | | 100.00 | 2000.00 | | | | 40.000 | |
| Tinuvin 123 | 737.20 | 1.0038 | 40.0 | 25.10 | 0.034 | 0.10 | 2.00 | 0.003 | | | 0.080 | |
| Irgafos 168 | 647.00 | 1.0012 | 40.0 | 25.03 | 0.039 | 0.00 | 0.00 | 0.000 | 0.000 | 0.000 | 0.000 | |
| Lupersol 231 | 302.50 | 1.0043 | 40.0 | 25.11 | 0.083 | 1.25 | 25.00 | 0.083 | | | 0.996 | 1.075 |
| Primer Z-6030 | 248.35 | 1.0066 | 40.0 | 25.17 | 0.101 | 0.250 | 5.00 | 0.020 | | | 0.199 | 1.274 |
| NREL-V3 | | | | | | | | | | | | |
| Elvax 150 | | 2.000 | 40.0 | 50.00 | | 100.00 | 2000.00 | | | | 40.000 | |
| Tinuvin 123 | 737.20 | 1.0038 | 40.0 | 25.10 | 0.034 | 0.20 | 4.00 | 0.005 | | | 0.159 | |
| Irgafos 168 | 647.00 | 1.0012 | 40.0 | 25.03 | 0.039 | 0.00 | 0.00 | 0.000 | 0.000 | 0.000 | 0.000 | |
| Lupersol 231 | 302.50 | 1.0043 | 40.0 | 25.11 | 0.083 | 1.25 | 25.00 | 0.083 | | | 0.996 | 1.155 |
| Primer Z-6030 | 248.35 | 1.0066 | 40.0 | 25.17 | 0.101 | 0.250 | 5.00 | 0.020 | | | 0.199 | 1.354 |
| NREL-V4 | | | | | | | | | | | | |
| Elvax 150 | | 2.000 | 40.0 | 50.00 | | 100.00 | 2000.00 | | | | 40.000 | |
| Tinuvin 123 | 737.20 | 1.0038 | 40.0 | 25.10 | 0.034 | 0.30 | 6.00 | 0.008 | | | 0.239 | |
| Irgafos 168 | 647.00 | 1.0012 | 40.0 | 25.03 | 0.039 | 0.00 | 0.00 | 0.000 | 0.000 | 0.000 | 0.000 | |
| Lupersol 231 | 302.50 | 1.0043 | 40.0 | 25.11 | 0.083 | 1.25 | 25.00 | 0.083 | | | 0.996 | 1.235 |
| Primer Z-6030 | 248.35 | 1.0066 | 40.0 | 25.17 | 0.101 | 0.250 | 5.00 | 0.020 | | | 0.199 | 1.433 |
| NREL-V5 | | | | | | | | | | | | |
| Elvax 150 | | 2.000 | 40.00 | 50.00 | | 100.00 | 2000.00 | | | | 40.000 | |
| Tinuvin 123 | 737.20 | 1.0038 | 40.0 | 25.10 | 0.034 | 0.20 | 4.00 | 0.008 | | | 0.159 | |
| Irgafos 168 | 647.00 | 1.0012 | 40.0 | 25.03 | 0.039 | 0.05 | 1.00 | 0.002 | 0.250 | 0.285 | 0.040 | |
| Lupersol 231 | 302.50 | 1.0043 | 40.0 | 25.11 | 0.083 | 1.25 | 25.00 | 0.083 | | | 0.996 | 1.195 |
| Primer Z-6030 | 248.35 | 1.0066 | 40.0 | 25.17 | 0.101 | 0.250 | 5.00 | 0.020 | | | 0.199 | 1.394 |
| NREL-V6 | | | | | | | | | | | | |
| Elvax 150 | | 2.000 | 40.0 | 50.00 | | 100.00 | 2000.00 | | | | 40.000 | |
| Tinuvin 123 | 737.20 | 1.0038 | 40.0 | 25.10 | 0.034 | 0.20 | 4.00 | 0.005 | | | 0.159 | |
| Irgafos 168 | 647.00 | 1.0012 | 40.0 | 25.03 | 0.039 | 0.10 | 2.00 | 0.003 | 0.500 | 0.570 | 0.080 | |
| Lupersol 231 | 302.50 | 1.0043 | 40.0 | 25.11 | 0.083 | 1.25 | 25.00 | 0.083 | | | 0.996 | 1.235 |
| Primer Z-6030 | 248.35 | 1.0066 | 40.0 | 25.17 | 0.101 | 0.250 | 5.00 | 0.020 | | | 0.199 | 1.434 |
| NREL-V7 | | | | | | | | | | | | |
| Elvax 150 | | 2.000 | 40.0 | 50.00 | | 100.00 | 2000.00 | | | | 40.000 | |
| Tinuvin 123 | 737.20 | 1.0038 | 40.0 | 25.10 | 0.034 | 0.20 | 4.00 | 0.005 | | | 0.159 | |
| Irgafos 168 | 647.00 | 1.0012 | 40.0 | 25.03 | 0.039 | 0.15 | 3.00 | 0.005 | 0.750 | 0.855 | 0.120 | |
| Lupersol 231 | 302.50 | 1.0043 | 40.0 | 25.11 | 0.083 | 1.25 | 25.00 | 0.083 | | | 0.996 | 1.275 |
| Primer Z-6030 | 248.35 | 1.0066 | 40.0 | 25.17 | 0.101 | 0.250 | 5.00 | 0.020 | | | 0.199 | 1.474 |

TABLE 2-continued

NREL-V8

| | F.W. | wt (g) | vol (ml) | [Conc] (mg/ml) | [Conc] (M) | EVX wt % | Weight (mg) | Equiv. mmole | Stab./ UVA wt ratio | [Stab.]/ [UVA] mol ratio | AO/ UVS wt ratio | [AO]/ [UVS] mol ratio | Volume Added | Volume Added (ml) (No UVA) |
|---|---|---|---|---|---|---|---|---|---|---|---|---|---|---|
| Elvax 150 | | 2.000 | 40.0 | 50.00 | | 100.00 | 2000.00 | | | | | | 40.000 | |
| Tinuvin 123 | 737.20 | 1.0038 | 40.0 | 25.10 | 0.034 | 0.20 | 4.00 | 0.005 | | | | | 0.159 | |
| Irgafos 168 | 647.00 | 1.0012 | 40.0 | 25.03 | 0.039 | 0.20 | 4.00 | 0.006 | 1.000 | 1.139 | | | 0.160 | |
| Lupersol 231 | 302.50 | 1.0043 | 40.0 | 25.11 | 0.083 | 1.25 | 25.00 | 0.083 | | | | | 0.996 | 1.315 |
| Primer Z-6030 | 248.35 | 1.0066 | 40.0 | 25.17 | 0.101 | 0.250 | 5.00 | 0.020 | | | | | 0.199 | 1.514 |

NREL-V9

| | | | | | | | | | | | | | | |
|---|---|---|---|---|---|---|---|---|---|---|---|---|---|---|
| Elvax 150 | | 2.000 | 40.0 | 50.0 | | 100.00 | 2000.00 | | | | | | 40.000 | |
| Tinuvin 123 | 737.20 | 1.0038 | 40.0 | 25.10 | 0.034 | 0.15 | 3.00 | 0.004 | | | | | 0.120 | |
| Irgafos 168 | 647.00 | 1.0012 | 40.0 | 25.03 | 0.039 | 0.15 | 3.00 | 0.005 | 1.000 | 1.139 | | | 0.120 | |
| Lupersol 231 | 302.50 | 1.0043 | 40.0 | 25.11 | 0.083 | 1.25 | 25.00 | 0.083 | | | | | 0.996 | 1.235 |
| Primer Z-6030 | 248.35 | 1.0066 | 40.0 | 25.17 | 0.101 | 0.250 | 5.00 | 0.020 | | | | | 0.199 | 1.434 |

NREL-10

| | | | | | | | | | | | | | | |
|---|---|---|---|---|---|---|---|---|---|---|---|---|---|---|
| Elvax 150 | | 2.000 | 40.0 | 50.0 | | 100.00 | 2000.00 | | | | | | 40.000 | |
| Tinuvin 123 | 737.20 | 1.0038 | 40.0 | 25.10 | 0.034 | 0.00 | 0.00 | 0.000 | | | | | 0.000 | |
| Irgafos 168 | 647.00 | 1.0012 | 40.0 | 25.03 | 0.039 | 0.10 | 2.00 | 0.003 | #DIV/0! | #DIV/0! | | | 0.080 | |
| Lupersol 231 | 302.50 | 1.0043 | 40.0 | 25.11 | 0.083 | 1.25 | 25.00 | 0.083 | | | | | 0.996 | 1.076 |
| Primer Z-6030 | 248.35 | 1.0066 | 40.0 | 25.17 | 0.101 | 0.250 | 5.00 | 0.020 | | | | | 0.199 | 1.274 |

NREL-V11

| | | | | | | | | | | | | | | |
|---|---|---|---|---|---|---|---|---|---|---|---|---|---|---|
| Elvax 150 | | 2.000 | 40.0 | 50.00 | | 100.00 | 2000.00 | | | | | | 40.000 | |
| Tinuvin 123 | 737.20 | 1.0038 | 40.0 | 25.10 | 0.034 | 0.00 | 0.00 | | | | | | 0.000 | |
| Irgafos 168 | 647.00 | 1.0012 | 40.0 | 25.03 | 0.039 | 0.00 | 0.00 | 0.000 | #DIV/0! | #DIV/0! | | | 0.000 | |
| Lupersol 231 | 302.50 | 1.0043 | 40.0 | 25.11 | 0.083 | 1.25 | 25.00 | 0.083 | | | | | 0.996 | |
| Primer Z-6030 | 248.35 | 1.0066 | 40.0 | 25.17 | 0.101 | 0.250 | 5.00 | 0.020 | | | | | 0.199 | 1.194 |

NREL-V12

| | | | | | | | | | | | | | | |
|---|---|---|---|---|---|---|---|---|---|---|---|---|---|---|
| Elvax 150 | | 2.000 | 40.0 | 50.00 | | 100.00 | 2000.00 | | | | | | 40.000 | |
| Tinuvin 123 | 737.20 | 1.0038 | 40.0 | 25.10 | 0.034 | 0.10 | 2.00 | 0.003 | | | | | 0.080 | |
| Irgafos 168 | 647.00 | 1.0012 | 40.0 | 25.03 | 0.039 | 0.00 | 0.00 | 0.000 | 0.000 | 0.000 | | | 0.000 | |
| Lupersol 231 | 302.50 | 1.0043 | 40.0 | 25.11 | 0.083 | 1.25 | 25.00 | 0.083 | | | | | 0.996 | 1.075 |
| Primer Z-6030 | 248.35 | 1.0066 | 40.0 | 25.17 | 0.101 | 0.250 | 5.00 | 0.020 | | | | | 0.199 | 1.274 |

New Stock Solutions Prepared for use:

| | F.W. (g/mol) | wt (g) | vol (ml) | [mg/ml] | solvent |
|---|---|---|---|---|---|
| Lupersol 231 | 302.50 | 1.0071 | 40.0 | 25.18 | C6H12 |
| Tinuvin 123 | 737.20 | 1.0038 | 40.0 | 25.10 | C6H12 |
| Tinuvin 770 | 478.00 | 1.0039 | 40.0 | 25.10 | C6H12 |
| Irgafos 168 | 647.00 | 1.0012 | 40.0 | 25.03 | C6H12 |
| Naugard 10 | 1178.00 | 1.0048 | 40.0 | 25.12 | THF |
| Naugard 76 | 531.00 | 1.0025 | 40.0 | 25.06 | C6H12 |
| Ethanox 398 | 486.70 | 0.5012 | 40.0 | 12.53 | C6H12 |
| Primer Z-6030 | 248.35 | 1.0066 | 40.0 | 25.17 | C6H12 |

TABLE 3

| Formula Name Additive | F.W. (g/mol) | Solution Concentrations | | | | Desired Add/ EVX wt % | Weight (mg) | Equiv. mmole | Stab./ UVA wt ratio | [Stab.]/ [UVA] mol ratio | AO/ UVS wt ratio | [AO]/ [UVS] olar ratio | Volume Added | Volume Added (ml) (No UVA) |
|---|---|---|---|---|---|---|---|---|---|---|---|---|---|---|
| | | Weighed (g) | C6H12 (ml) | [Conc] (mg/ml) | [Conc] (M) | | | | | | | | | |

NREL-Y1, Y6 | | | | | | | | | | | | | Y1 | Y6

| Elvax 150 W | | 2.000 | 40.0 | 50.00 | | 100.00 | 2000.00 | | | | | | 40.000 | 40.000 |
| Tinuvin P | 225.00 | 1.0070 | 40.0 | 25.18 | 0.112 | 0.250 | 5.00 | 0.022 | 1.00 | 1.00 | | | 0.199 | 0.000 |
| Tinuvin 123 | 737.20 | 1.0038 | 40.0 | 25.10 | 0.034 | 0.150 | 3.00 | 0.004 | 0.60 | 0.18 | | | 0.120 | 0.120 |
| Irgafos 168 | 647.00 | 1.0012 | 40.0 | 25.03 | 0.039 | 0.138 | 2.76 | 0.004 | 0.55 | 0.19 | 0.920 | 1.048 | 0.110 | 0.110 |
| Lupersol 231 | 302.50 | 1.0043 | 40.0 | 25.11 | 0.083 | 1.250 | 25.00 | 0.083 | | | | | 0.996 | 0.996 |
| Primer Z-6030 | 248.35 | 1.0066 | 40.0 | 25.17 | 0.101 | 0.250 | 5.00 | 0.020 | | | | | 0.199 | 0.199 |

NREL-Y2, Y7 | | | | | | | | | | | | | Y2 | Y7

| Elvax 150 W | | 2.000 | 40.0 | 50.00 | | 100.00 | 2000.00 | | | | | | 40.000 | 40.000 |
| Tinuvin P | 225.0 | 1.0070 | 40.0 | 25.18 | 0.112 | 0.250 | 5.00 | 0.022 | 1.00 | 1.00 | | | 0.199 | 0.000 |
| Tinuvin 123 | 737.20 | 1.0038 | 40.0 | 25.10 | 0.034 | 0.150 | 3.00 | 0.004 | 0.60 | 0.18 | | | 0.120 | 0.120 |
| Naugard 10 | 1175.00 | 1.0048 | 40.0 | 25.12 | 0.021 | 0.250 | 5.00 | 0.004 | 1.00 | 0.19 | 1.667 | 1.043 | 0.199 | 0.199 |
| Lupersol 231 | 302.50 | 1.0043 | 40.0 | 25.11 | 0.083 | 1.250 | 25.00 | 0.083 | | | | | 0.996 | 0.996 |
| Primer Z-6030 | 245.35 | 1.0066 | 40.0 | 25.17 | 0.101 | 0.250 | 5.00 | 0.020 | | | | | 0.199 | 0.199 |

NREL-Y3, Y8 | | | | | | | | | | | | | Y3 | Y8

TABLE 3-continued

|  | F.W. | wt | vol. |  |  |  |  |  |  |  |  |  |  |
|---|---|---|---|---|---|---|---|---|---|---|---|---|---|
| Elvax 150 W |  | 2.000 | 40.0 | 50.00 |  | 100.00 | 2000.00 |  |  |  |  |  | 40.000 | 40.000 |
| Tinuvin P | 225.0 | 1.0070 | 40.0 | 25.18 | 0.112 | 0.250 | 5.00 | 0.022 | 1.00 | 1.00 |  |  | 0.199 | 0.000 |
| Tinuvin 123 | 737.20 | 1.0038 | 40.0 | 25.10 | 0.034 | 0.150 | 3.00 | 0.004 | 0.60 | 0.18 |  |  | 0.120 | 0.120 |
| Naugard 76 | 531.00 | 1.0025 | 40.0 | 25.06 | 0.047 | 0.114 | 2.28 | 0.004 | 0.76 | 0.19 | 0.760 | 1.055 | 0.091 | 0.091 |
| Lupersol 231 | 302.50 | 1.0043 | 40.0 | 25.11 | 0.083 | 1.250 | 25.00 | 0.083 |  |  |  |  | 0.996 | 0.996 |
| Primer Z-6030 | 248.35 | 1.0066 | 40.0 | 25.17 | 0.101 | 0.250 | 5.00 | 0.020 |  |  |  |  | 0.199 | 0.199 |
| NREL-Y4, Y9 |  |  |  |  |  |  |  |  |  |  |  |  | Y4 | Y9 |
| Elvax 150 |  | 2.000 | 40.0 | 50.00 |  | 100.00 | 2000.00 |  |  |  |  |  | 40.000 | 40.000 |
| Tinuvin P | 225.0 | 1.0070 | 40.0 | 25.18 | 0.112 | 0.250 | 5.00 | 0.022 | 1.00 | 1.00 |  |  | 0.199 | 0.000 |
| Tinuvin 123 | 737.20 | 1.0038 | 40.0 | 25.10 | 0.034 | 0.150 | 3.00 | 0.004 | 0.60 | 0.18 |  |  | 0.120 | 0.120 |
| Ethanox 398 | 486.70 | 0.5012 | 40.0 | 12.53 | 0.026 | 0.105 | 2.10 | 0.004 | 0.700 | 0.190 | 0.700 | 1.060 | 0.168 | 0.168 |
| Lupersol 231 | 302.50 | 1.0043 | 40.0 | 25.11 | 0.083 | 1.25 | 25.00 | 0.083 |  |  |  |  | 0.996 | 0.996 |
| Primer Z-6030 | 248.35 | 1.0066 | 40.0 | 25.17 | 0.101 | 0.250 | 5.00 | 0.020 |  |  |  |  | 0.199 | 0.199 |
| NREL-Y5, Y10 |  |  |  |  |  |  |  |  |  |  |  |  | Y5 | Y10 |
| Elvax 150 W |  | 2.000 | 40.0 | 50.00 |  | 100.000 | 2000.00 |  |  |  |  |  | 40.000 | 40.000 |
| Tinuvin P | 225.00 | 1.0070 | 40.0 | 25.18 | 0.112 | 0.250 | 5.00 | 0.022 | 1.00 | 1.00 |  |  | 0.199 | 0.000 |
| Tinuvin 770 | 478.00 | 1.0039 | 40.0 | 25.10 | 0.053 | 0.150 | 3.00 | 0.006 | 0.60 | 0.28 |  |  | 0.120 | 0.120 |
| Ethanox 398 | 486.70 | 0.5012 | 40.0 | 12.53 | 0.026 | 0.160 | 3.20 | 0.007 | 1.07 | 0.30 | 1.067 | 1.048 | 0.255 | 0.255 |
| Lupersol 231 | 302.50 | 1.0043 | 40.0 | 25.11 | 0.083 | 1.250 | 25.00 | 0.083 |  |  |  |  | 0.996 | 0.996 |
| Primer Z-6030 | 248.35 | 1.0066 | 40.0 | 25.17 | 0.101 | 0.250 | 5.00 | 0.020 |  |  |  |  | 0.199 | 0.199 |
| NREL-Y11, Y12 |  |  |  |  |  |  |  |  |  |  |  |  | Y11 | Y12 |
| Elvax 150 W |  | 2.000 | 40.0 | 50.00 |  | 100.00 | 2000.00 |  |  |  |  |  | 40.000 | 40.000 |
| Tinuvin P | 225.0 | 1.0070 | 40.0 | 25.18 | 0.112 | 0.250 | 5.00 | 0.022 | 1.00 | 1.00 |  |  | 0.199 | 0.000 |
| Tinuvin 123 | 737.20 | 1.0038 | 40.0 | 25.10 | 0.034 | 0.150 | 3.00 | 0.004 | 0.60 | 0.18 |  |  | 0.120 | 0.120 |
| Tinuvin 770 | 478.00 | 1.0039 | 40.0 | 25.10 | 0.053 | 0.150 | 3.00 | 0.006 | 0.60 | 0.28 |  |  | 0.120 | 0.120 |
| Ethanox 398 | 486.70 | 0.5012 | 40.0 | 12.53 | 0.026 | 0.160 | 3.20 | 0.007 | 1.07 | 0.30 | 0.533 | 0.636 | 0.255 | 0.255 |
| Lupersol 231 | 302.50 | 1.0043 | 40.0 | 25.11 | 0.083 | 1.250 | 25.00 | 0.083 |  |  |  |  | 0.996 | 0.996 |
| Primer Z-6030 | 248.35 | 1.0066 | 40.0 | 25.17 | 0.101 | 0.250 | 5.00 | 0.020 |  |  |  |  | 0.199 | 0.199 |

|  | F.W. (g/m) | wt (g) | vol. (ml) | [mg/ml] | solvent |
|---|---|---|---|---|---|
| Lupersol 231 | 302.50 | 1.0071 | 40.0 | 25.18 | C6H12 |
| Tinuvin 123 | 737.20 | 1.0038 | 40.0 | 25.10 | C6H12 |
| Tinuvin 770 | 478.00 | 1.0039 | 40.00 | 25.10 | C6H12 |
| Tinuvin P | 225.00 | 1.0070 | 40.0 | 25.18 | THF |
| Irgafos 168 | 647.00 | 1.0012 | 40.0 | 25.03 | C6H12 |
| Naugard 10 | 1178.00 | 1.0048 | 40.0 | 25.12 | THF |
| Naugard 76 | 531.00 | 1.0025 | 40.0 | 25.06 | C6H12 |
| Ethanox 398 | 486.70 | 0.5012 | 40.0 | 12.53 | C6H12 |
| A174 primer | 248.35 | 1.0066 | 40.0 | 25.17 | C6H12 |

The foregoing description is considered as illustrative only of the principles of the invention. Further, since numerous modifications and changes will readily occur to those skilled in the art, it is not desired to limit the invention to the exact construction and process shown as described above. Accordingly, resort may be made to all suitable modifications and equivalents that fall within the scope of the invention as defined by the claims which follow.

The embodiments of the invention in which an exclusive property or privilege is claimed are defined as follows:

1. A photothermally stable, transparent composition for encapsulating a photovoltaic device, the composition comprising a polymer, a curing agent, and an ultraviolet light stabilizer, wherein said curing agent is 1,1-di-(t-butylperoxy)-3,3,5-trimethylcyclohexane and said composition is free of an ultraviolet light absorber component.

2. The composition of claim 1, wherein said polymer is an olefin-vinyl acetate copolymer.

3. The composition of claim 2, wherein said olefin-vinyl acetate copolymer is ethylene-vinyl acetate having between about 25 percent and about 35 percent vinyl acetate, wherein said percentages are on a weight/weight basis.

4. The composition of claim 1, wherein said ultraviolet light stabilizer is bis-(N-octyloxy-tetramethyl) piperidinyl sebacate.

5. The composition of claim 1, wherein said composition comprises from about 0.05% to about 5.0% curing agent, and from about 0.01% to about 2.0% ultraviolet light stabilizer, wherein said percentages are on a weight/weight basis.

6. The composition of claim 1, wherein said composition comprises from about 1.0% to about 2.0% curing agent, and from about 0.1% to about 0.5% ultraviolet light stabilizer, wherein said percentages are on a weight/weight basis.

7. The composition of claim 1, wherein said composition comprises about 1.25% curing agent, and from about 0.20% to about 0.25% ultraviolet light stabilizer, wherein said percentages are on a weight/weight basis.

8. The composition of claim 1, wherein said composition further comprises an antioxidant is selected from the group consisting of tris (2,4-di-tert-butylphenyl) phosphite, tetrakis methylene (3,5-di-tert-butyl-4-hydroxyhydrocinnamate, and 2,2'-ethylidene bis (4,6-di-t-butylphenyl) fluorophosponite.

9. The composition of claim 7, wherein said antioxidant is tris (2,4-di-tert-butylphenyl) phosphite.

10. The composition of claim 8 wherein said composition comprises from about 0.01% to about 2.0% antioxidant, wherein said percentages are on a weight/weight basis.

11. The composition of claim 8 wherein said composition comprises from about 0.20% to about 0.25% antioxidant, wherein said percentages are on a weight/weight basis.

12. The composition of claim 1, further comprising a primer.

13. The composition of claim 12, wherein said primer is γ-methacryloxypropyl trimethoxysilane.

14. The composition of claim 12, wherein said composition comprises from about 0.01% to about 2.0% primer, wherein said percentage is on a weight/weight basis.

15. The composition of claim 12, wherein said composition comprises from about 0.2% to about 0.3% primer, wherein said percentage is on a weight/weight basis.

16. A photothermally stable, transparent composition for encapsulating a photovoltaic device, the composition comprising a polymer and a curing agent, wherein said polymer is ethylene-vinyl acetate having between about 25 percent and about 35 percent vinyl acetate, wherein said percentages are on a weight/weight basis, and said curing agent is 1,1-di-(t-butylperoxy)-3,3,5-trimethylcyclohexane, wherein said composition is free of an ultraviolet light absorber component.

17. The composition of claim 16, wherein said composition further comprises an ultraviolet light stabilizer, wherein said ultraviolet light stabilizer is bis-(N-octyloxy-tetramethyl) piperidinyl sebacate.

18. The composition of claim 16 further comprising an antioxidant, wherein said antioxidant is selected from the group consisting of tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis(4,6-di-t-butylphenyl) fluorophosponite.

19. The composition of claim 16 further comprising a primer, wherein said primer is γ-methacryloxypropyl trimethoxysilane.

20. A photothermally stable, transparent composition for encapsulating a photovoltaic device, the composition comprising a polymer, a curing agent, an ultraviolet light stabilizer, and an antioxidant, wherein said ultraviolet light stabilizer is bis-(N-octyloxy-tetramethyl)piperidinyl sebacate, and wherein said antioxidant is selected from the group consisting of tris (2,4-di-tert-butylphenyl)phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis (4,6-di-t-butylphenyl) fluorophosponite, wherein said composition is free of an ultraviolet light absorber component.

21. The composition of claim 20, wherein said polymer is ethylene-vinyl acetate having between about 25 percent and about 35 percent vinyl acetate, wherein said percentages are on a weight/weight basis.

22. The composition of claim 20, wherein said curing agent is selected from the group consisting of 1,1-di-(t-butylperoxy)-3,3,5-trimethylcyclohexane, 2,5-dimethyl-2,5-di-t-butylperoxyhexane, and O,O-t-butyl-O-(2-ethylhexyl) mono-peroxy-carbonate.

23. The composition of claim 20 further comprising a primer, wherein said primer is γ-methacryloxypropyl trimethoxysilane.

24. A photothermally stable, transparent composition for encapsulating a photovoltaic device, the composition comprising a polymer, a curing agent, and an antioxidant, wherein said antioxidant is selected from the group consisting of tris (2,4-di-tert-butylphenyl)phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis (4,6-di-t-butylphenyl) fluorophosponite, wherein said composition is free of an ultraviolet light absorber component.

25. The composition of claim 24, wherein said polymer is ethylene-vinyl acetate having between about 25 percent and about 35 percent vinyl acetate, wherein said percentages are on a weight/weight basis.

26. The composition of claim 24, wherein said curing agent is selected from the group consisting of 1,1-di-(t-butylperoxy)-3,3,5-trimethylcyclohexane, 2,5-dimethyl-2,5-di-t-butylperoxyhexane, and O,O-t-butyl-O-(2-ethylhexyl) mono-peroxy-carbonate.

27. The composition of claim 24 further comprising a primer, wherein said primer is γ-methacryloxypropyl trimethoxysilane.

28. A photovoltaic device comprising:
a photovoltaic cell; and
a photothermally stable, transparent encapsulating material on the upper surface of said photovoltaic cell, the encapsulating material comprising a polymer, a curing agent, and an ultraviolet light stabilizer, wherein said curing agent is 1,1-di-(t-butylperoxy)-3,3,5-trimethylcyclohexane, and wherein said encapsulating material is free of an ultraviolet light absorber component.

29. The photovoltaic device of claim 28, wherein said polymer is ethylene-vinyl acetate having between about 25 percent and about 35 percent vinyl acetate, wherein said percentages are on a weight/weight basis, and wherein said ultraviolet light stabilizer is bis-(N-octyloxy-tetramethyl) piperidinyl sebacate.

30. The photovoltaic device of claim 28, wherein said photovoltaic device further comprises a layer of encapsulating material on the lower surface of said photovoltaic cell, wherein the layer of encapsulating material comprises a polymer, a curing agent, and an ultraviolet light stabilizer, wherein said curing agent is 1,1-di-(t-butylperoxy)-3,3,5-trimethylcyclohexane.

31. A photovoltaic device comprising:
a photovoltaic cell; and
a photothermally stable, transparent encapsulating material on the upper surface of said photovoltaic cell, the encapsulating material comprising ethylene-vinyl acetate having between about 25 percent and about 35 percent vinyl acetate, wherein said percentages are on a weight/weight basis, and 1,1-di-(t-butylperoxy)-3,3,5-trimethylcyclohexane, and wherein said encapsulating material is free of an ultraviolet light absorber component.

32. The photovoltaic device of claim 31, wherein said encapsulating material further comprises bis-(N-octyloxy-tetramethyl) piperidinyl sebacate.

33. A method for encapsulating a solar cell comprising the steps of:
preparing a photothermally stable, transparent encapsulating material comprising a polymer, a curing agent, and an ultraviolet light stabilizer, wherein said curing agent is 1,1-di-(t-butylperoxy)-3,3,5-trimethylcyclohexane, and wherein said encapsulating material is free of an ultraviolet light absorber component;
applying said encapsulating material to the solar cell; and
curing the applied encapsulating material at a curing temperature for a predetermined curing period to form a thermoset encapsulant for the solar cell.

34. The method of claim 33, wherein said polymer is ethylene-vinyl acetate having between about 25 percent and about 35 percent vinyl acetate, wherein said percentages are on a weight/weight basis, and wherein said ultraviolet light stabilizer is bis-(N-octyloxy-tetramethyl) piperidinyl sebacate.

35. A method for encapsulating a solar cell comprising the steps of:

preparing a photothermally stable, transparent encapsulating material comprising ethylene-vinyl acetate having between about 25 percent and about 35 percent vinyl acetate, wherein said percentages are on a weight/weight basis, and 1,1-di-(t-butylperoxy)-3,3,5-trimethylcyclohexane, and wherein said encapsulating material is free of an ultraviolet light absorber component;

applying said encapsulating material to the solar cell; and curing the applied encapsulating material at a curing temperature for a predetermined curing period to form a thermoset encapsulant for the solar cell.

36. The method of claim 35, wherein said encapsulating material further comprises an ultraviolet light stabilizer and an antioxidant, wherein said ultraviolet light stabilizer is bis-(N-octyloxy-tetramethyl) piperidinyl sebacate, and wherein said antioxidant is selected from the group consisting of tris (2,4-di-tert-butylphenyl) phosphite, tetrakis methylene (3,5-di-tert-butyl-4-hydroxyhydrocinnamate) methane, octadecyl 3,5-di-tert-butyl-4-hydroxyhydrocinnamate, and 2,2'-ethylidene bis(4,6-di-t-butylphenyl) fluorophosponite.

37. The method of claim 34, wherein said curing temperature is between about 150° C. and about 160° C. and said curing period is less than about 6 minutes.

38. The method of claim 36, wherein said curing temperature is between about 150° C. and about 160° C. and said curing period is less than about 6 minutes.

* * * * *